(12) United States Patent
Aoyama et al.

(10) Patent No.: US 7,323,901 B2
(45) Date of Patent: Jan. 29, 2008

(54) SEMICONDUCTOR INTEGRATED CIRCUIT DEVICE

(75) Inventors: Satoshi Aoyama, Inazawa (JP); Atsuhiro Hayashi, Akishima (JP); Yasuhiko Takahashi, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 118 days.

(21) Appl. No.: 11/375,109

(22) Filed: Mar. 15, 2006

(65) Prior Publication Data

US 2006/0158216 A1 Jul. 20, 2006

Related U.S. Application Data

(63) Continuation of application No. 10/889,037, filed on Jul. 13, 2004, now Pat. No. 7,038,486.

(30) Foreign Application Priority Data

Jul. 15, 2003 (JP) .............................. 2003-274771

(51) Int. Cl.
*H03K 19/003* (2006.01)
(52) U.S. Cl. ..................... 326/30; 326/21; 326/86; 327/108
(58) Field of Classification Search .................. 326/30, 326/21, 86; 327/108
See application file for complete search history.

(56) References Cited

U.S. PATENT DOCUMENTS

| | | | |
|---|---|---|---|
| 6,384,621 B1 | 5/2002 | Gibbs et al. | |
| 6,535,047 B2 | 3/2003 | Mughal et al. | |
| 6,545,522 B2 | 4/2003 | Mughal et al. | |
| 6,570,406 B2 | 5/2003 | Tang et al. | |
| 6,621,352 B2 | 9/2003 | Matsumoto et al. | |
| 6,628,223 B2 | 9/2003 | Nagano | |
| 6,836,143 B2 | 12/2004 | Song | |
| 6,894,529 B1 * | 5/2005 | Chong et al. | .................. 326/30 |
| 6,909,312 B2 | 6/2005 | Mitsumoto | |
| 7,093,145 B2 * | 8/2006 | Werner et al. | ............... 713/300 |
| 7,176,729 B2 * | 2/2007 | Hayashi et al. | ............. 327/108 |
| 7,227,377 B2 * | 6/2007 | Kurts et al. | ................... 326/30 |
| 7,262,643 B2 * | 8/2007 | Hayashi et al. | ............. 327/108 |

FOREIGN PATENT DOCUMENTS

JP 10-242835 2/1997

* cited by examiner

*Primary Examiner*—Vibol Tan
(74) *Attorney, Agent, or Firm*—Reed Smith LLP; Stanley P. Fisher, Esq.; Juan Carlos A. Marquez, Esq.

(57) ABSTRACT

A plurality of sets of circuits are provided, each of which generates an impedance code through the use of an impedance control circuit in association with a resistive element connected to an external terminal, and each of which varies the impedance in accordance with such an impedance code. The impedance control circuit includes an impedance comparator which is formed equivalently to the resistive element and the plurality of sets of circuits, and which performs an impedance comparison with each of a plurality of replica circuits to form an up signal that increases the impedance and a down signal that decreases the impedance. Counters are provided adjacent to the individuals of the plurality of sets of circuits to thereby generate the impedance codes in response to the up signal and the down signal.

6 Claims, 28 Drawing Sheets

SEMICONDUCTOR INTEGRATED CIRCUIT DEVICE

This application is Continuation of U.S. application Ser. No. 10/889,037 filed Jul. 13, 2004 now U.S. Pat. No. 7,038,486. This application claims priority to U.S. application Ser. No. 10/889,037 filed Jul. 13, 2004, which claims priority to Japanese Patent Application No. 2003-274771 filed on Jul. 15, 2003, the contents of which are hereby incorporated by reference into this application.

FIELD OF THE INVENTION

The present invention relates to a semiconductor device, and, more specifically, to a method, system, and device for data transfer at high frequency.

BACKGROUND OF THE INVENTION

In order to perform the transfer of data between a memory LSI (Large Scale Integration) and a MPU (Microprocessor) or the like at high speed (high frequency), it is necessary to to impedance match the transmission system and to suppress distortion of the transfer waveform caused by reflection. It is known to control the impedance of the output driver of a high-speed synchronous SRAM (Static Random Access Memory) so as to provide an impedance equal to the resistance value of a resistive element connected to a dedicated LSI pin, for the purpose of impedance matching.

The controlling or adjusting of output impedance for data transfer has been disclosed in, for example, Japanese Unexamined Patent Publication No. Hei 10(1998)-242835. In the referenced patent publication, an output impedance adjustment transistor and a through-rate adjustment transistor are provided in order to control output impedance. More specifically, a shot pulse is applied to the gate of the through-rate adjustment transistor to control a rise time interval and an output voltage level as determined by the impedance adjustment transistor.

Thus, the need exists for a semiconductor device, system, and method that provides data transfer at high frequency using impedance matching, and that reduces the wiring and complexity of the same.

SUMMARY OF THE INVENTION

The present invention relates to a semiconductor integrated circuit device and method suitable for enabling data transfer at a high frequency.

In a semiconductor device, the output impedance may be adjusted so as to become equal to the resistance value of a resistive element. However, in such an embodiment, a relatively large number of control signals may be required to adjust, or control, the resistance value with sufficiently high accuracy. For example, in order to control impedance of $2^7$ types, for example, P channel and N channel MOSFETs, respectively, necessitate control signals of 7 bits. For a 7 bit control signal, it would be necessary to provide 7×2=14 signal lines. In order to provide terminating circuits to perform the impedance control discussed hereinabove, large numbers of wirings are necessitated. In a semiconductor integrated circuit device, such as a memory, a great many signals are concentrated, and hence extra wiring channels are required to pass the many signals to the terminating circuits. In such a configuration, signal lines and channels may be distributed over the entire semiconductor chip on which the semiconductor device is resident, and thus the probability of failure in the signal distribution system increases in a complex semiconductor device, thereby correspondingly reducing product yield.

The present invention provides a semiconductor integrated circuit device equipped with an impedance control circuit. More specifically, the present invention provides a semiconductor integrated circuit device that is simplistic in use and that enhances data transfer rate.

The present invention includes a plurality of circuit sets, each of which generates an impedance code through the use of an impedance control circuit associated with at least one resistive element connected to an external terminal, wherein the impedance of an output of a semiconductor circuit is varied in accordance with the impedance code. The impedance control circuit may include an impedance comparator having an impedance range equivalent to the at least one resistive element, and each of the plurality performs an impedance comparison via the impedance comparator with the resistive element resistance to generate a signal to increase, decrease, or maintain the impedance of the output. Counters may be provided for the plurality, wherein the counters may generate one or more impedance codes responsively to the increase, decrease, or maintain signal.

The present invention may additionally provide first and second impedance circuits, which may vary impedance in accordance with the impedance code. The first circuit and second circuit may each be formed equivalently to the resistive element, and may perform impedance comparisons via the respective impedance comparators with one or more impedance replica circuits in order to supply impedance codes to the first and second impedance circuits. For example, an external terminal and the first and second circuits may be connected by redistribution wirings.

An impedance control circuit may generate an impedance code in association with a resistive element connected to an external terminal, and may convert the impedance code to serial data for transfer to a plurality of sets of impedance circuits, each of which varies the impedance. The plurality of sets of impedance circuits reproduce the impedance code from the serial data.

Thus, the number of wirings that pass through a chip center for impedance control are reduced by the present invention, and the probability of a cord-blown failure due to foreign materials and breaks with respect to the number of wirings is thus also reduced. and the present invention also enhances a data transfer rate over a system.

BRIEF DESCRIPTION OF THE DRAWINGS

The various features of the present invention will now be described in greater detail with reference to the drawings of aspects of the present invention, and various related elements thereof, wherein like reference numerals designate like elements, and wherein.

DETAILED DESCRIPTION

It is to be understood that the figures and descriptions of the present invention have been simplified to illustrate elements that are relevant for a clear understanding of the present invention, while eliminating, for purposes of clarity, many other elements found in a typical semiconductor device and method. Those of ordinary skill in the art will recognize that other elements are desirable and/or required in order to implement the present invention. But because such elements are well known in the art, and because they do not facilitate a better understanding of the present invention, a discussion of such elements is not provided herein. The disclosure herein is directed to all such variations and modifications to the applications, networks, systems and methods disclosed herein and as will be known, or apparent, to those skilled in the art.

Figure 1:
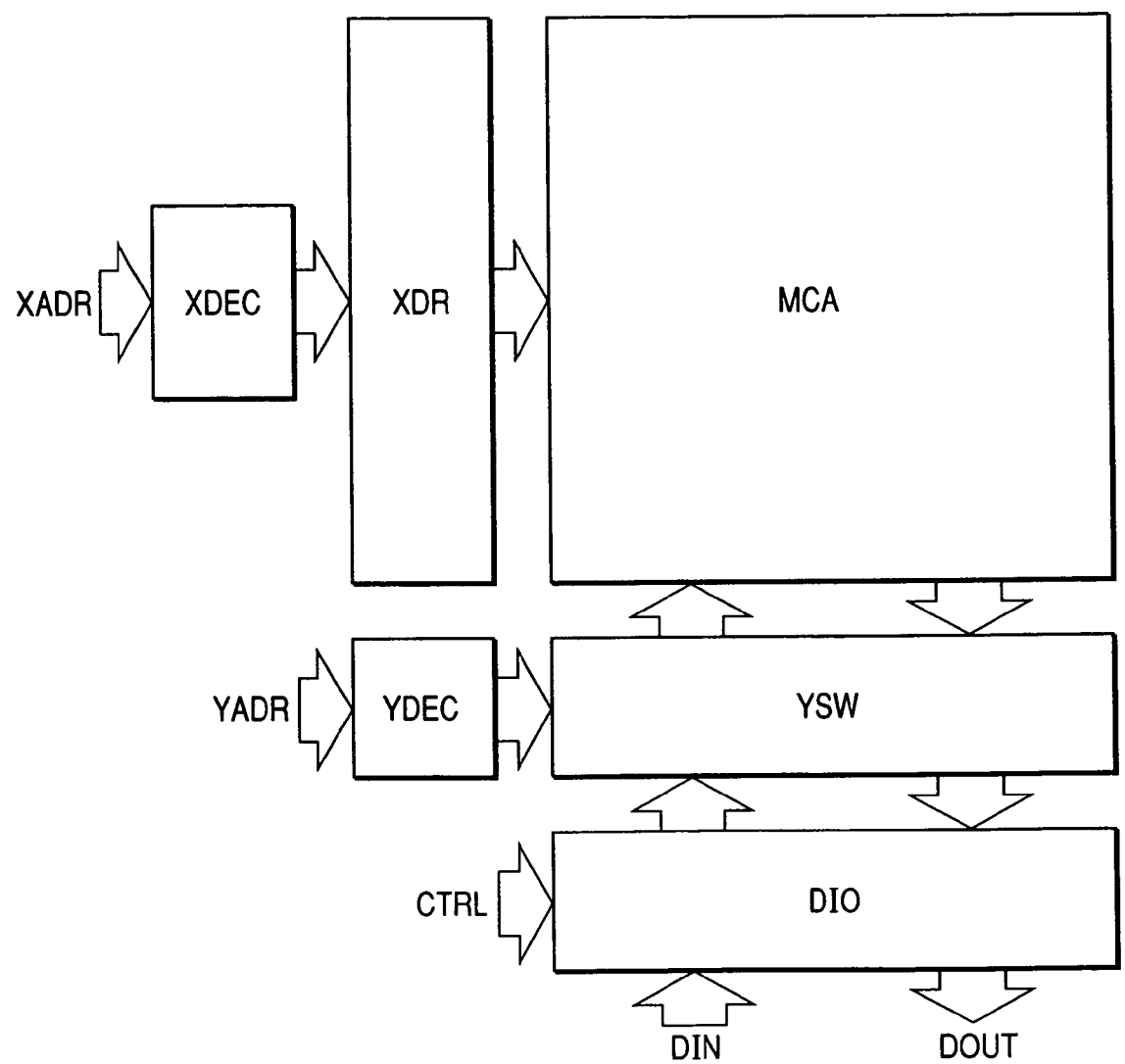
FIG. 1 is a block diagram showing a semiconductor memory.

A block diagram of an embodiment of a semiconductor memory related to the present invention is shown in FIG. 1. XADR is a row address signal, YADR is a column address signal, DIN is a data input signal, CTRL is a memory control signal, and DOUT is a data output signal. XDEC is a row address decoder, XDR is a word line driver which applies a select pulse voltage to a word line corresponding to a row address, and MCA is a memory cell array wherein a plurality of memory cells are arranged in matrix form. YDEC is a column address decoder, YSW is a column selection circuit which selects a bit line pair corresponding to a column address, and DIO is a data input/output circuit, including an input circuit which writes a data input signal DIN into a selection cell based on the memory control signal CTRL and an output circuit, which output circuit amplifies information about the selection cell and outputs a data output signal DOUT.

Figure 2:
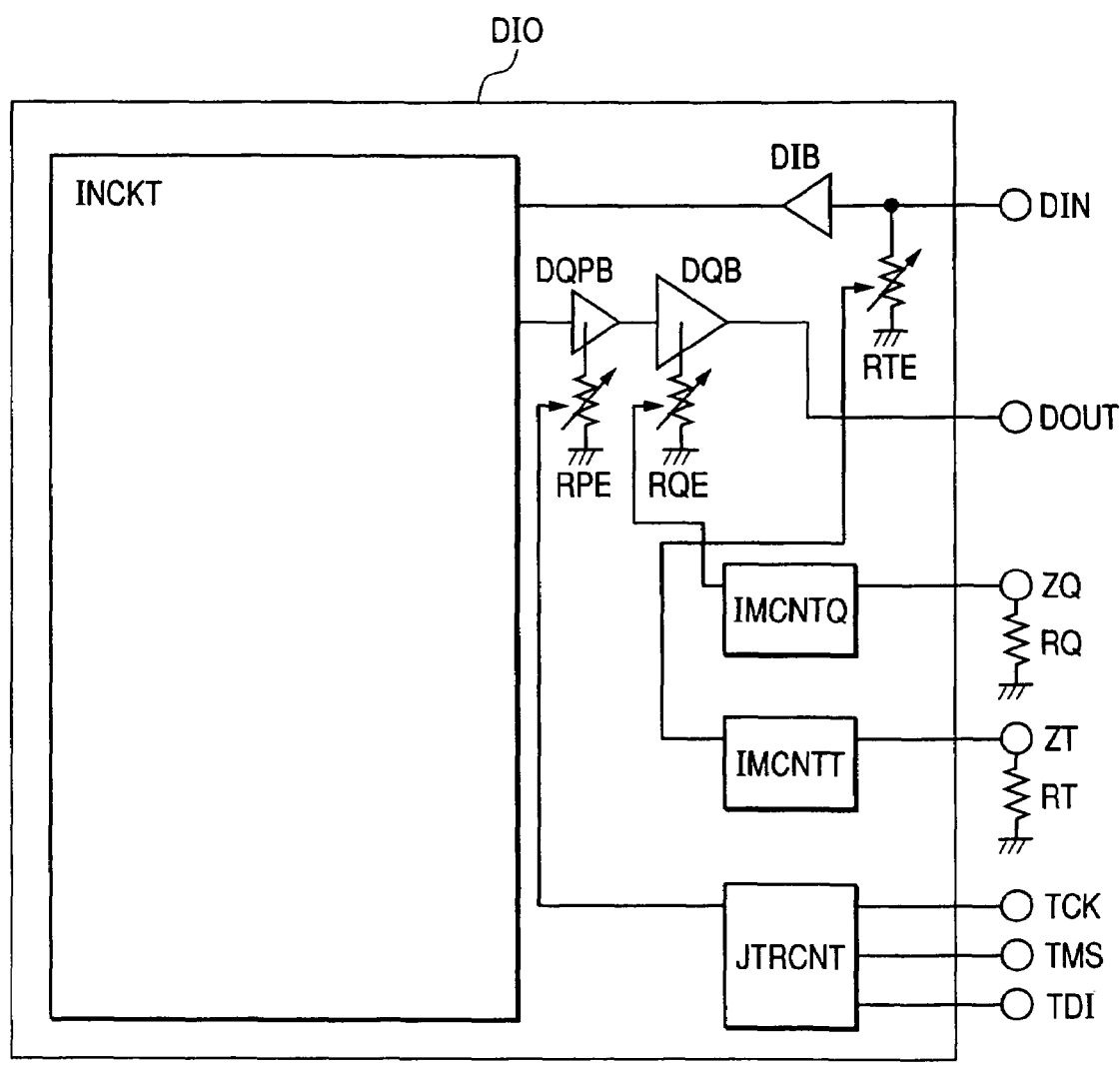
FIG. 2 is a block diagram illustrating interior of a data input/output circuit DIO of the semiconductor memory shown in FIG. 1.

A block diagram of the interior of the data input/output circuit DIO employed in the semiconductor memory shown in FIG. 1 is shown in FIG. 2. DIN is a data input signal (input terminal), and DOUT is a data output signal (output terminal). DIB is an input buffer, and DQB is an output buffer of the data input/output circuit, and DQPB is an output prebuffer of the data input/output circuit.

RTE is a variable resistor, i.e., a terminating resistor, for adjusting or controlling input impedance of a terminal which receives the data input signal. In an embodiment, an impedance control circuit IMCNTT adjusts the resistance value of the terminating resistor RTE on the basis of the resistance value of a resistor RT connected to a terminal ZT. RQE is a variable resistor for adjusting the output impedance of the output terminal OUT which transmits the data output signal, and RQE typifies the output impedance of the output buffer DQB. In an embodiment, an impedance control circuit IMCNTQ adjusts the resistance value of RQE on the basis of the resistance value of a resistor RQ connected to a terminal ZQ.

RPE is a resistor for adjusting a data output signal through rate, and is equivalent to the impedance of the output prebuffer employed above, for example. In an embodiment, a through rate control circuit JTRCNT using JTAG (IEEE standard 1149.1 proposed by Joint Test Action Group) adjusts the resistance value of RPE based on JTAG input signals (TCK, TMS and TDI). Incidentally, RQE/RTE may be adjusted by JTAG. An internal circuit INCKT includes a read amplifier which forms read data, a write amplifier which receives write data, or a control circuit or the like which controls read and write data, for example.

In the semiconductor memory, the output impedance RQE of the output buffer DQB is set by the external resistor RQ, and a terminating resistor RTE is built in which the resistance value is set to that of the input terminal in association with the external resistor RT. Therefore, in a system including a processor or the like connected to the semiconductor memory through transmission lines over a printed circuit board, the external resistors RQ and RT having the resistance values corresponding to the characteristic impedances of the transmission lines are connected to the external terminals ZQ and ZT, thereby making it possible to match the output impedance of the outer buffer with that of the corresponding transmission line, and to match between the terminating resistor RTE connected to the input terminal DIN with the characteristic impedance of the corresponding transmission line.

Thus, when a read signal is transferred to the processor or the like through a transmission line connected to the output terminal DOUT, such as wherein a read operation is done from the semiconductor memory through the use of the processor or the like, reflection noise developed in a system wherein a terminating resistor is not connected to an input circuit of the processor or the like can be absorbed by the output impedance RQE of the output buffer, and high-speed reading is enabled because the re-reflection noise is not transmitted to the processor side. Even when the terminating resistor is provided in the input circuit of the processor or the like, noise produced when impedance matching is incomplete can be absorbed by the output impedance RQE of the output buffer, thereby enabling high-speed and stable data transfer.

Since the terminating resistor RTE, which is connected to the input terminal DIN to which an address signal and write data are transmitted, is matched with the characteristic impedance of the corresponding transmission line whereon the operation of writing into the semiconductor memory is carried out by the processor or the like, a high-speed write operation is enabled. That is, high-speed data transfer is enabled over the system without connecting an externally-provided terminating resistor to the external terminal, and hence an easy-to-use semiconductor memory is realized. Although the data input terminal DIN and the data output terminal DOUT are provided in a separated form in the embodiment shown in FIG. 1, both terminals may be shared as a data input/output terminal DQ.

Figure 3:
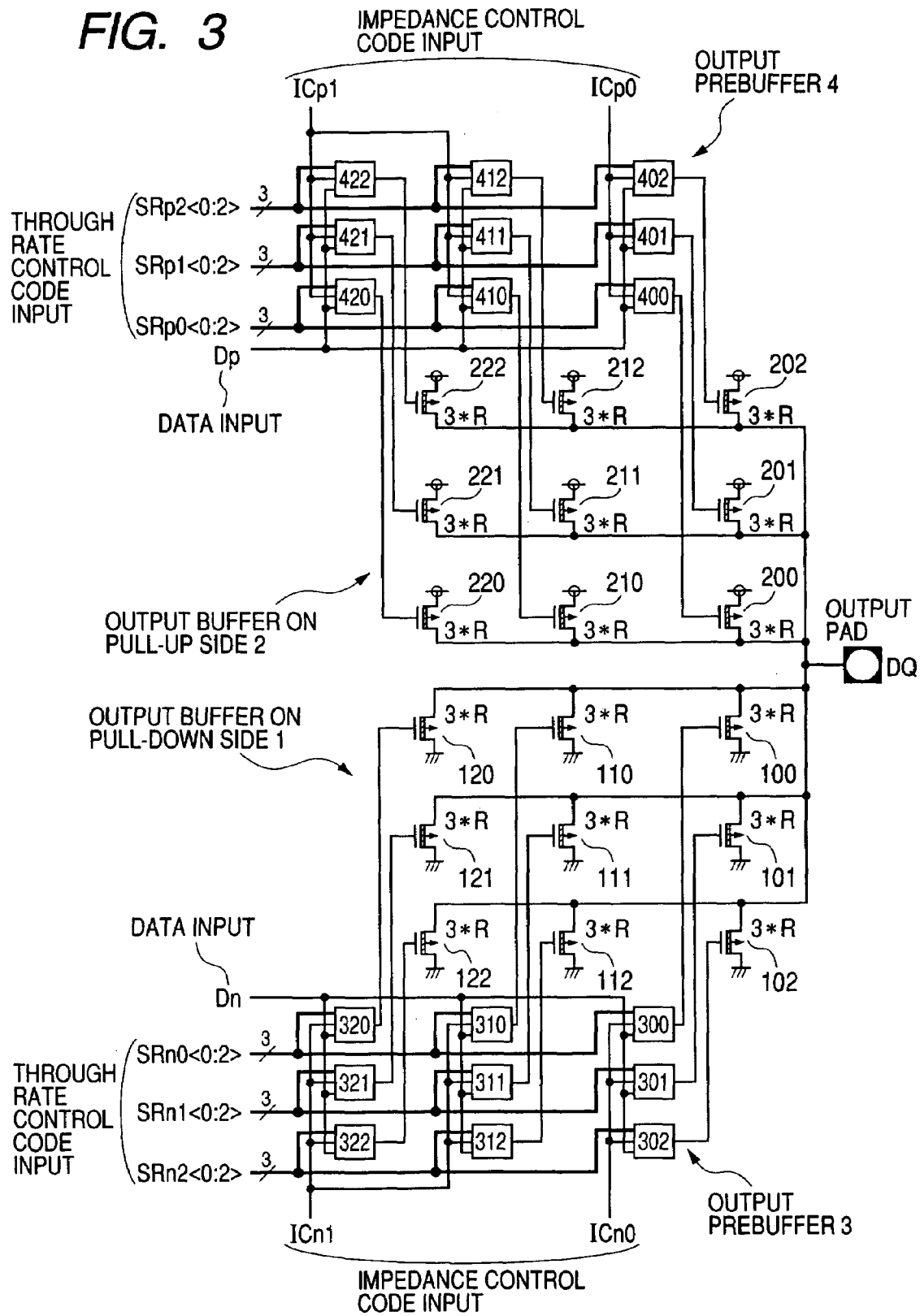
FIG. 3 is a schematic circuit diagram depicting an output buffer provided in a semiconductor integrated circuit device.

A schematic circuit diagram of an embodiment of an output buffer provided in a semiconductor integrated circuit device according to the present invention is shown in FIG. 3. The embodiment provides a CMOS output circuit, configured by combining an output buffer 1 on the pull-down side, which sends an output signal of a low level from an output terminal DQ, and an output buffer 2 on the pull-up side, which sends an output signal of a high level.

The output buffer 1 on the pull-down side includes a plurality of N channel output MOSFETs 100 through 122. These output MOSFETs 100 through 122 may be provided in parallel configurations by allowing the drains thereof to be connected in common to the output terminal DQ and supplying a circuit ground potential to the sources thereof. The output MOSFETs 100 through 102, 110 through 112 and 120 through 122 are arranged in the form of 3 rows by 3 columns. Although not so restricted, the nine output MOSFETs 100 through 122 illustratively shown are formed such that their on-resistance values become equal to one another like 3*R (=3×R).

An output prebuffer 3 is provided corresponding to the respective output MOSFETs 100 through 122. The output prebuffer 3 include 300 through 302, 310 through 312 and 320 through 322 corresponding to the respective output MOSFETs 100 through 122, and are arranged in the form of 3 rows by 3 columns. Drive signals formed by the nine output prebuffers 300 through 322 are transferred to the corresponding gates of the output MOSFETs 100 through 122.

Of the output MOSFETs 100 through 122, the output MOSFETs 100 through 102 are set as an output buffer group corresponding to an impedance control code IC0, and the output MOSFETs 110 through 112 and 120 through 122 are set as an output buffer group corresponding to an impedance control code IC1. Of the output MOSFETs 100 through 122, the output MOSFETs 100, 110 and 120 are set as an output buffer group corresponding to a through rate control code SRn0, the output MOSFETs 101, 111 and 121 are set as an output buffer group corresponding to a through rate control code SRn1, and the output MOSFETs 102, 112 and 122 are set as an output buffer group corresponding to a through rate control code SRn2.

The output prebuffers 300 through 302 corresponding to the output MOSFETs 100 through 102 of the one output buffer group are respectively supplied with the impedance control code IC0. The output prebuffers 310 through 312 and 320 through 322 corresponding to the output MOSFETs 110 through 122 of the other output buffer group are respectively supplied with the impedance control code IC1.

The prebuffers 300, 310 and 320 provided corresponding to the output MOSFETs of the output buffer group, the prebuffers 301, 311 and 321 provided corresponding to the output MOSFETs of the output buffer group, and the prebuffers 302, 312 and 322 provided corresponding to the output MOSFETs of the output buffer are respectively supplied with through rate control codes SRn0, SRn1 and SRn2 as described above. These through rate control codes SRn0, SRn1 and SRn2 are respectively constituted of 3-bit signals as represented in the form of <0:2>. Further, the nine output prebuffers 300 through 322 are supplied with a data input D. The data input D is formed by an internal circuit and is a data signal to be outputted to the outside of the semiconductor integrated circuit device through the output terminal DQ.

In an embodiment, the on-resistance values of the output MOSFETs 100 through 122 are set to 3*R (=3×R). Consequently, the total impedance is set as R in the output buffer group controlled by the impedance control code IC0, and the total impedance is set R/2 in the output buffer group controlled by the impedance control code IC1.

In an embodiment, as described above, the respective output buffer groups are divided into the output buffer group controlled by the through rate control code SRn0 <0:2>, the output buffer group controlled by the through rate control code SRn1 <0:2>, and the output buffer group controlled by the through rate control code SRn2 <0:2>. The output prebuffer 3 is configured in such a manner that the constants of the prebuffers connected to the output MOSFETs of the same size become identical.

The output buffer 2 on the pull-up side includes a plurality of P channel output MOSFETs 200 through 222. These output MOSFETs 200 through 222 are provided in parallel configurations by causing their drains to be connected in common to the output terminal DQ and supplying a power supply voltage to their sources. The output MOSFETs 200 through 222 will be described in further details. The output MOSFETs 200 through 202, 210 through 212 and 220 through 222 are arranged in the form of 3 rows by 3 columns in a manner similar to the output buffer 1 on the pull-down side. Although not so restricted, the nine output MOSFETs 200 through 222 are formed such that their on-resistance values become equal to one another like 3*R (=3×R).

An output prebuffer 4 is provided corresponding to the respective output MOSFETs 200 through 222. The output prebuffer 4 includes 400 through 402, 410 through 412 and 420 through 422 corresponding to the respective output MOSFETs 200 through 222 and are arranged in the form of 3 rows by 3 columns. Drive signals formed by the nine output prebuffers 400 through 422 are transferred to their corresponding gates of the output MOSFETs 200 through 222.

Figure 4:
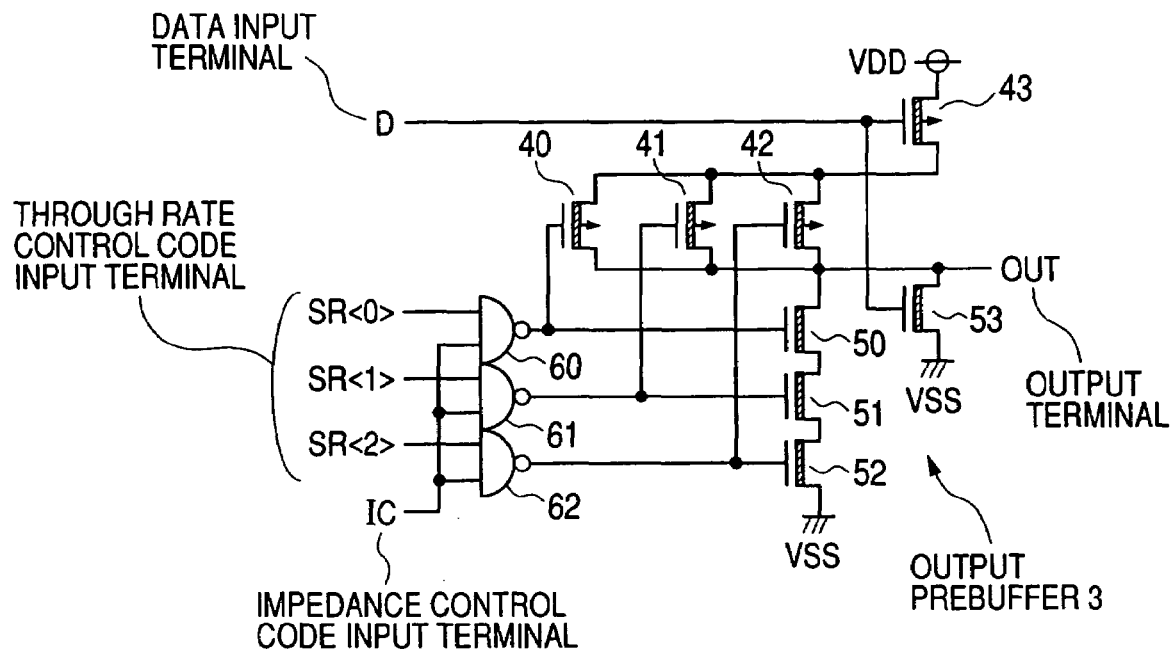
FIG. 4 is a circuit diagram showing an output prebuffer 3 shown in FIG. 3.

A circuit diagram illustrative of an embodiment of the output prebuffer 3 shown in FIG. 3 is shown in FIG. 4. In the same drawing, D designates a data input terminal, and OUT designates an output terminal and is connected to the gates of the output MOSFET 200, etc. corresponding to the output buffers. IC designates an impedance control code input terminal, and SR<0>, SR<1> and SR<2> indicate through rate control code input terminals respectively.

P channel MOSFETs 40 through 42 are configured in parallel and their drains connected in common are connected to the output terminal OUT. The sources connected in common, of the P channel MOSFETs 40 through 42, are respectively supplied with a power supply voltage VDD by a P channel MOSFET Q43 which receives data to be outputted supplied from the data input terminal D. An N channel MOSFET Q53 is provided between the output terminal OUT and a circuit ground potential VSS and switch-controlled by the data to be outputted supplied from the data input terminal D.

N channel MOSFETs 50 through 52 are provided in series configurations between the output terminal OUT and the circuit ground potential VSS. The gates of the P channel MOSFETs 40 through 42 and N channel MOSFETs 50 through 52 are shared to transmit output signals of NAND gates 60, 61 and 62 therethrough. One input of the NAND gates 60 through 62 is supplied with an impedance control code IC0 or IC1 from the input terminal IC. The other inputs of the NAND gates 60 through 62 are supplied with any of the through rate control codes SR0<0:2>, SR1<0:2> and SR2<0:2> from the input terminals SR<0>, SR<1> and SR<2>.

The output prebuffer employed in the present embodiment is switched to either selection or non-selection by the impedance control code input terminal IC. Therefore, the IC0 or IC1 is supplied to the impedance control code input terminal IC in FIG. 4 to enable the selection of the output buffer group to be operated. Any of the SR<0 through 2> is supplied to the through rate control code input terminals to thereby select a combination of PMOSs for an on state, of the P channel MOSFETs 40 through 42, whereby a load driving force (on resistance) of the output prebuffer is varied. That is, the time required to allow a drive signal transmitted to the gate of the output MOSFET 100 or the like to rise is adjusted.

Figure 5:
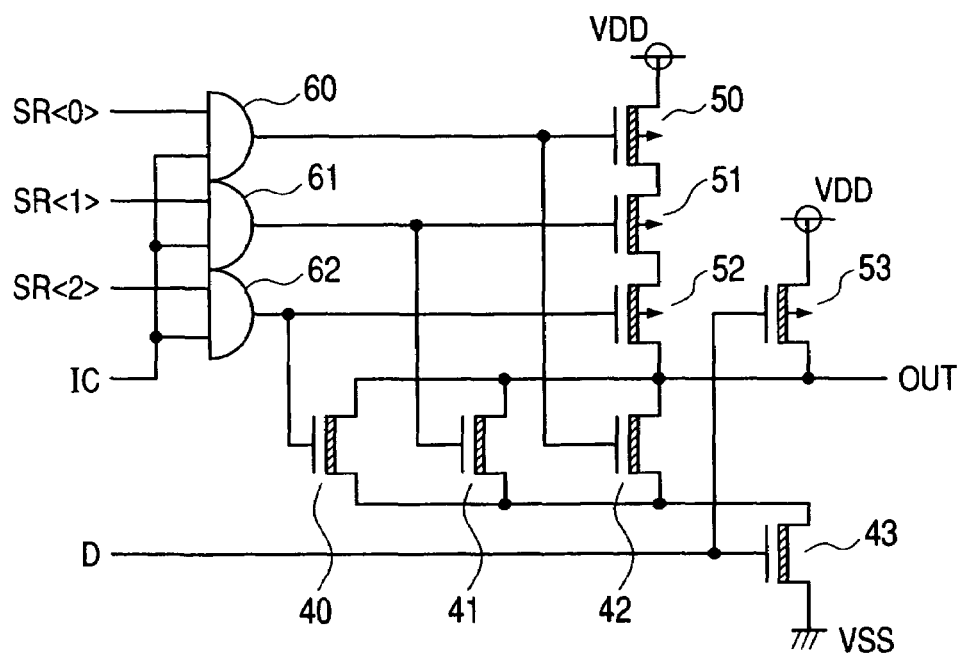
FIG. 5 is a circuit diagram illustrating an output prebuffer 4 shown in FIG. 3.

A circuit diagram showing an embodiment of the output prebuffer 4 in FIG. 3 is shown in FIG. 5. In the same drawing, D designates a data input terminal, and OUT designates an output terminal and is connected to the gates of the output MOSFET 200, etc. corresponding to the output buffers. IC designates an impedance control code input terminal, and SR<0>, SR<1> and SR<2> indicate through rate control code input terminals in a manner similar to the FIG. 4.

The output prebuffer employed in the present embodiment is configured such that the relationship of connections between the P channel MOSFETs and N channel MOSFETs shown in FIG. 4 is interchanged. That is, drive signals for bringing P channel output MOSFETs to an on state are respectively formed by N cannel MOSFETs 40 through 42 provided in parallel configurations. An N channel MOSFET 43, which receives data D, is used as a switch for supplying a circuit ground potential VSS to the N channel MOSFETs 40 through 42. A MOSFET for resetting the output terminal OUT to a high level in response to the data D is configured as a P channel MOSFET 53. Then, P channel MOSFETs 50 through 52 are connected in series configurations and provided between the output terminal and a power supply voltage VDD. Gates 60 through 62 that receive an impedance control code IC and through rate control codes SR<0>, SR<1> and SR<2> therein are configured as AND gates as an alternative to the NAND gates.

In the embodiment described above, impedance control and through rate control can be set separately (independently) without interacting with each other. The configuration of the adjustment or control circuit can be simplified. Further, the MOSFETs for carrying out the impedance control and the MOSFETs for performing the through rate control may make use of common output MOSFETs and hence pin capacity can be reduced as compared with the case in which buffers are respectively provided in discrete form. Even when environmental conditions, such as temperatures and voltages, vary and the combination of the output MOSFETs for setting the impedance to a set value changes, the through rate amount can be kept constant as long as the impedance is constant.

The embodiment shown in FIG. 3 includes the output buffer 2 on the pull-up side and the output buffer 1 on the pull-down side as described above. In the present embodiment, the impedance of the output buffer on the pull-down side is adjusted by impedance control code inputs ICn0 and ICn1 and the through rate is adjusted by through rate control code inputs SRn0<0:2> through SRn2<0:2>. The impedance of the output buffer on the pull-up side is adjusted by impedance control code inputs ICp0 and ICp1, and the through rate is adjusted by through rate control code inputs SRp0<0:2> through SRp2<0:2>.

In the present embodiment, the ratio of impedances among a subgroup of the N channel type output MOSFETs 100, 110 and 120, a subgroup of the N channel type output MOSFETs 101, 111 and 121, and a subgroup of the N channel type output MOSFETs 102, 112 and 122 is set so as to become constant even when the impedance codes ICn0 and ICn1 change. Even when the impedance codes ICp0 and ICp1 change, the ratio of impedances among a subgroup of the P channel type output MOSFETs 200, 210 and 220, a subgroup of the P channel type output MOSFETs 201, 211 and 221 and a subgroup of the P channel type output MOSFETs 202, 212 and 222 is set so as to be constant.

Figure 6:
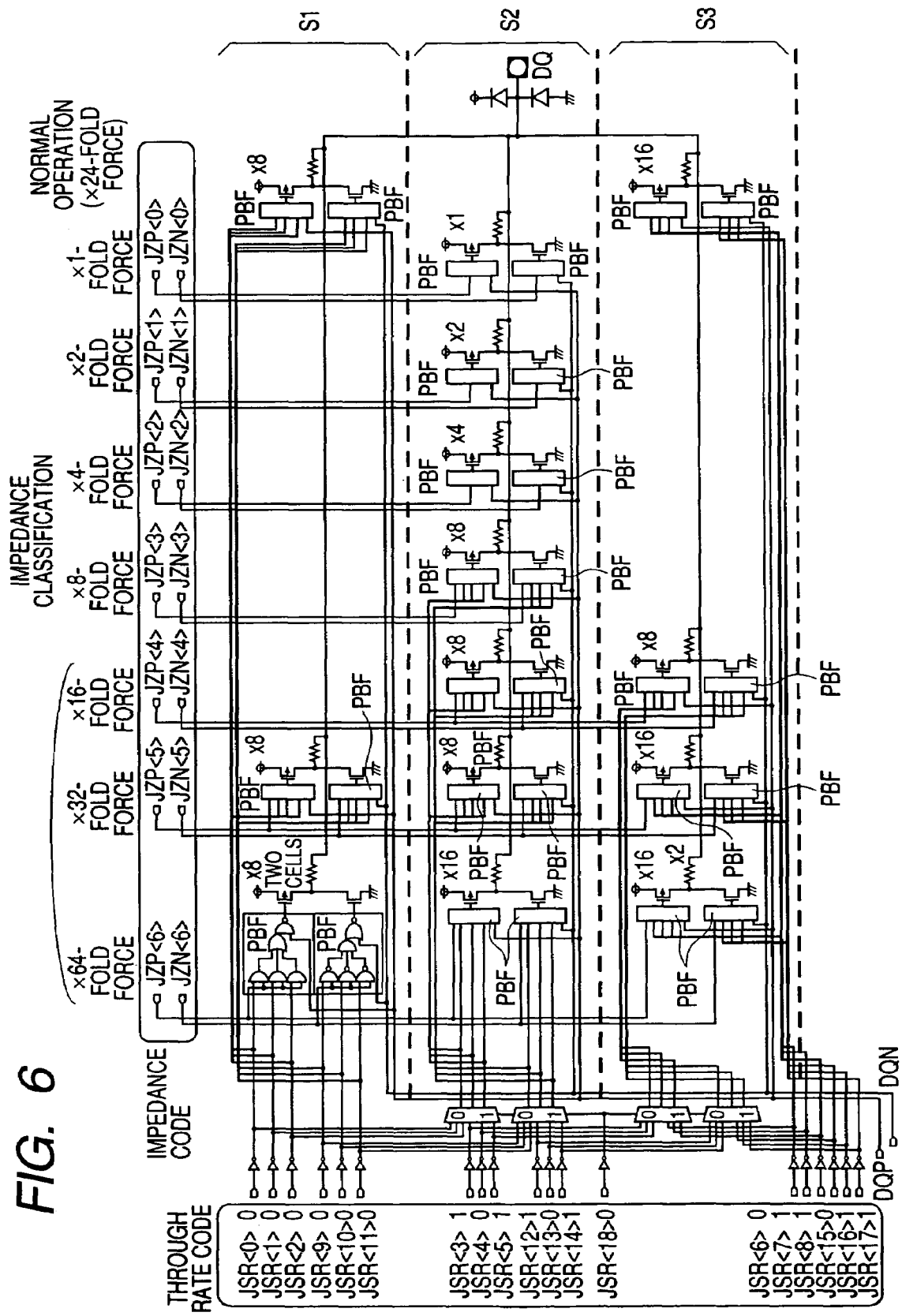
FIG. 6 is a configurational diagram depicting an output buffer provided in a semiconductor integrated circuit device.

A configurational diagram of an embodiment of an output buffer provided in a semiconductor integrated circuit device according to the present invention is shown in FIG. 6. In the same drawing, DQP designates a data input on the pull-up side, DQN designates a data input on the pull-down side, and DQ designates a data output terminal, respectively. Impedance control is carried out by selecting a suitable combination from impedance classification of ×1-fold force through ×64-fold force on the basis of an impedance control code JZN<0:6> for selecting N channel type output MOSFETs on the pull-down side, and an impedance control code JZN<0:6> for selecting P channel type output MOSFETs on the pull-up side.

In an embodiment, a section of output MOSFETs ranging from ×16-fold force through ×64-fold force is divided into subgroups S1 through S3 in order to adjust or control a through rate to the output MOSFETs. The subgroup S1 is an output MOSFET group which first performs switching. The subgroup S2 is an output MOSFET group which brings the output MOSFETs of the subgroup S1 to an on state, and thereafter performs switching after the elapse of a time interval of Δt1. The subgroup S3 is an output MOSFET group which brings the output MOSFETs of the subgroup 2 to an on state and thereafter performs switching after the elapse of a time interval of Δt2.

In an embodiment, the output buffer includes output MOSFETs and resistive elements connected in series. Further, the ratio between the resistance value of on resistance of each MOSFET and the resistance value of each resistive element is kept constant. Therefore, since the voltage (Vds) applied across the source/drain terminal of each output MOSFET becomes constant without dependence on division buffer sizes, the impedance ratios become identical even when an output voltage changes. Thus, the impedance ratios can be kept constant without depending on the set value in the case of any output voltage.

Impedance control is performed by controlling the impedances of the output MOSFETs on the basis of 7-bit control signals JZP<0:6> and JZN<0:6> on the pull-up and pull-down sides. Through rate control is carried out by changing W sizes (channel widths) of MOSFETs for forming drive signals supplied to the gates of the output MOSFETs in accordance with control signals JSR<0:18>. Therefore, the impedance control and the through rate control can be set separately (independently) without interacting with each other, and hence the configuration of the control circuit is simplified. Further, since the MOSFETs for carrying out the impedance control and the MOSFETs for performing the through rate control are realized using common output MOSFETs, the pin capacity of the external terminal DQ can be reduced as compared with the case in which the output buffers (output MOSFETs) are respectively provided in discrete form.

Even when the impedance control codes JZN<0:6> and JZN<0:6> change due to environmental changes or the like, such as temperatures and voltages or the like, the through rate can be kept constant by classifying MOSs such that the size ratio between the through-rate controlled MOSFETs (S1 through S3) is not changed.

In the present embodiment, output MOSFETs each having a ×8-fold force and output prebuffers PBF for driving the same are provided for the subgroup S1 for the purpose of normal operation, and output MOSFETs each having a ×16-fold force and output prebuffers PBF for driving the same are provided for the subgroup S3, to thereby configure an output buffer having a ×24-fold force as a whole. Thus, the maximum value of the output impedance of the output buffer according to the present embodiment is set. That is, even when all of the impedance control codes JZN<0:6> and JZP<0:6> are zero, the output buffer for the normal operation is activated so that an output signal of a high level/low level can be formed under the maximum output impedance set.

Figure 7:
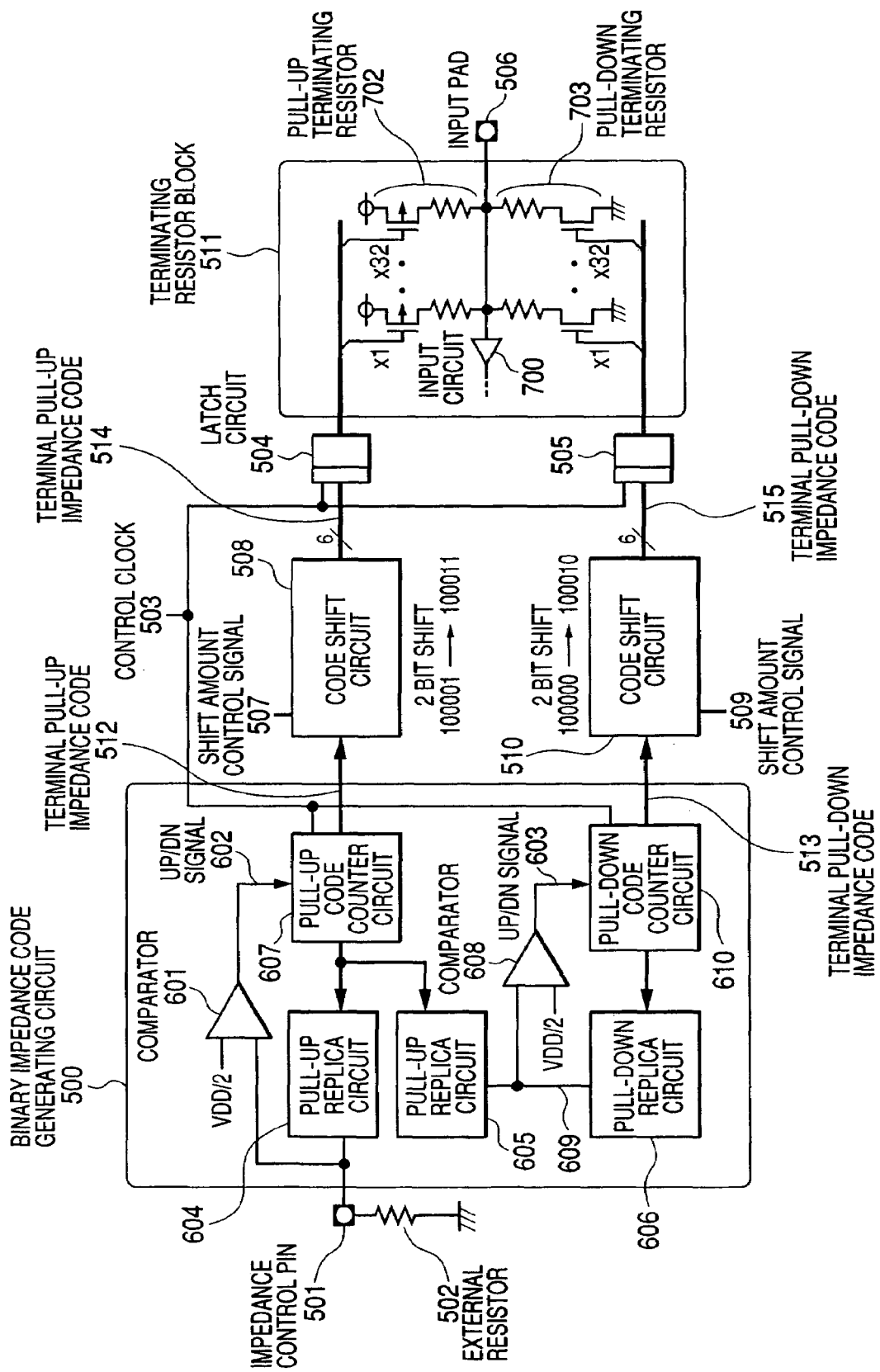
FIG. 7 is a block diagram showing an impedance control circuit of a terminating resistor.

A block diagram of an embodiment of an impedance control circuit of a terminating resistor is shown in FIG. 7. In a binary impedance code generating circuit 500, a comparator 601 for setting a reference voltage to VDD/2 such that the resistance value of a resistive element 602 connecting between an impedance control pin 501 and ground (circuit ground potential VSS) and an on resistance value of a pull-up replica circuit 604 lying in an LSI become equal. In other words, the voltage of the impedance control pin 501 reaches ½ of a power supply voltage VDD, and a pull-up code counter circuit 607 and a pull-up replica circuit 604 controlled are provided to configure a feedback loop, whereby a pull-up terminal impedance control code 512 is generated. That is, the count value of the pull-up code counter circuit is set in such a manner that the voltage of the impedance control pin 501 becomes closest to ½ of VDD.

A pull-down terminal impedance control code 513 is also generated by a similar method. That is, a pull-up replica circuit 605 similar in configuration to the pull-up replica circuit 604, and a pull-down replica circuit 606, are used to configure a circuit for dividing the power supply voltage VDD. A feedback loop is configured using a comparator 608 for setting a reference voltage to VDD/2 in such a manner that the voltage at a division point 609 of the division circuit reaches ½ of the power supply voltage VDD, and a pull-down code counter circuit 610 and a pull-down replica circuit 606 controlled thereby, whereby a pull-down terminal impedance control code 513 is generated.

As described above, the reference voltage of the comparator 601 is set to ½ of the power supply voltage VDD. This brings about an advantage in that when the impedance code on the pull-down side is generated, the replica circuit 605 that serves as a copy of the pull-up replica circuit 604 can be used as an alternative to the external resistor 502, thereby making it possible to simplify circuit configuration.

Next, the generated impedance codes are respectively shifted by an arbitrary bit number by code shift circuits 508 and 510. The shift amounts are set by control signals 507 and 509 respectively. Due to non-linearity of the on resistance of each MOSFET, a terminating resistance value is shifted high as the input potential is shifted from, VDD/2. Therefore, for example, a code shift-based correction based on a 2-bit shift is effected.

A terminal pull-up impedance code 514 formed by the code shift circuit 508 is temporarily brought to a latch 504 operated by a control clock. It is transmitted via the latch 504 to the gates of P channel MOSFETs formed such that resistance values of terminating resistors 702 on the pull-up side have binary weights as in the case of ×1 through ×32 constituting the terminating resistors 702, which constitute a terminating resistor block. Similarly, a terminal pull-down impedance code 515 formed by the code shift circuit 510 is temporarily brought to a latch 505 operated by the control clock and transferred via the latch 505 to the gates of N channel MOSFETs formed such that resistance values of terminating resistors 703 on the pull-down side have binary weights as in the case of ×1 through ×32 constituting the terminating resistors 702, which constitute a terminating resistor block.

The on resistance values of the MOSFETs have source-to-drain voltage dependency in a manner similar to the case of the impedance control of the output buffer. Therefore, the resistive elements are connected in series with the respective MOSFETs for the purpose of improvements in linearity thereof. The resistance values having the binary weights as in the case of ×1 through ×32 are set so as to contain the values of the resistive elements.

Figure 8:
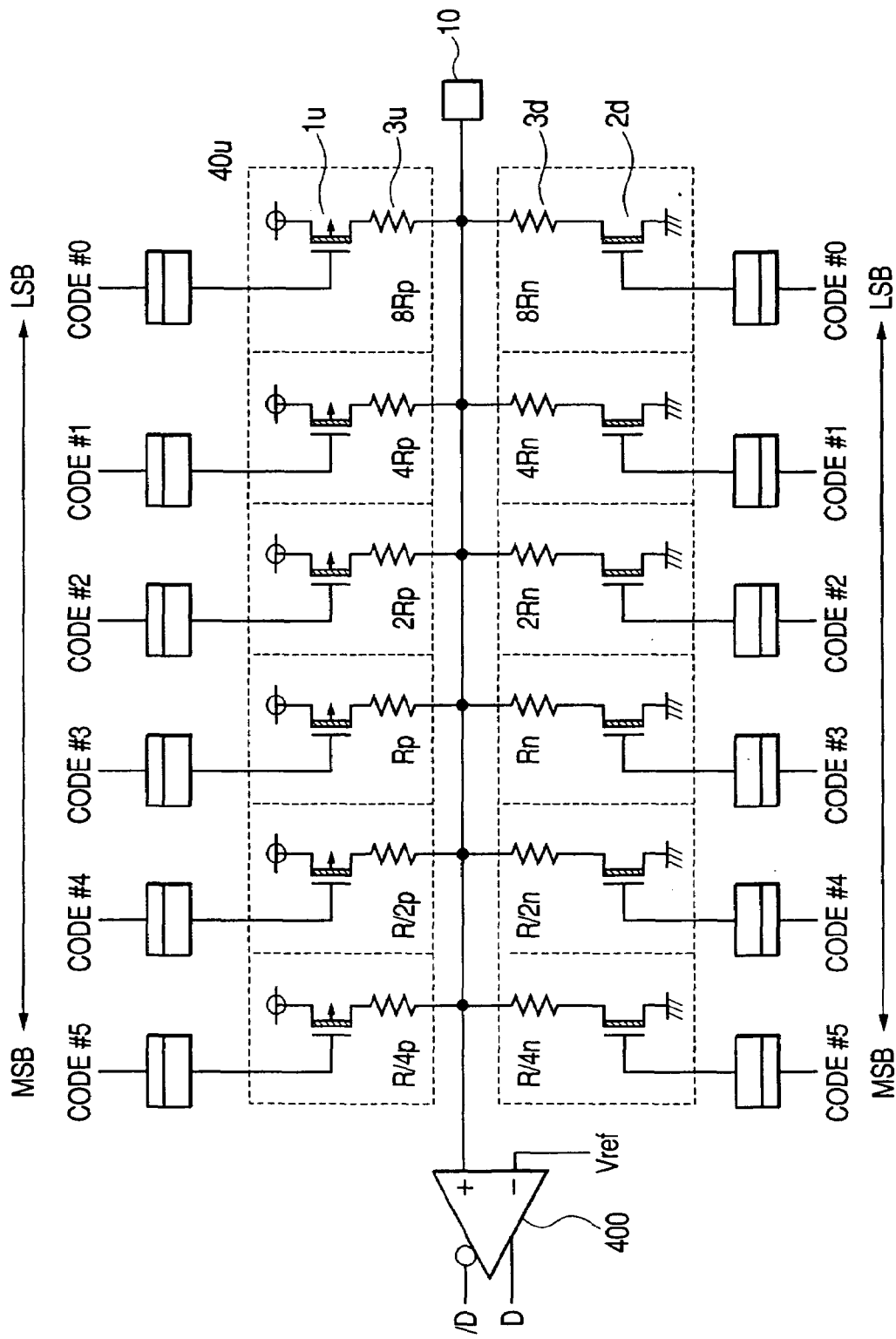
FIG. 8 is a circuit diagram illustrating a terminating resistor block.

A circuit diagram of an embodiment of a terminating resistor block according to the present invention is shown in FIG. 8. The terminating resistor of the present embodiment is formed inclusive of MOSFETs and resistive elements connected thereto such that their resistance values have binary weights. That is, the resistance values are respectively set as 8Rp, 8Rn, 4Rp, 4Rn, 2Rp, 2Rn, Rp, Rn, Rp/2, Rn/2, Rp/4 and Rn/4 in association with 6-bit binary codes comprising a code #0 (LSB), a code #1, a code #2, a code #3, a code #4 and a code #5 (MSB). The respective codes #0 through #5 are fetched into a latch. The codes brought to the latch are transferred to the gates of P channel MOSFETs and N channel MOSFETs.

Figure 9:
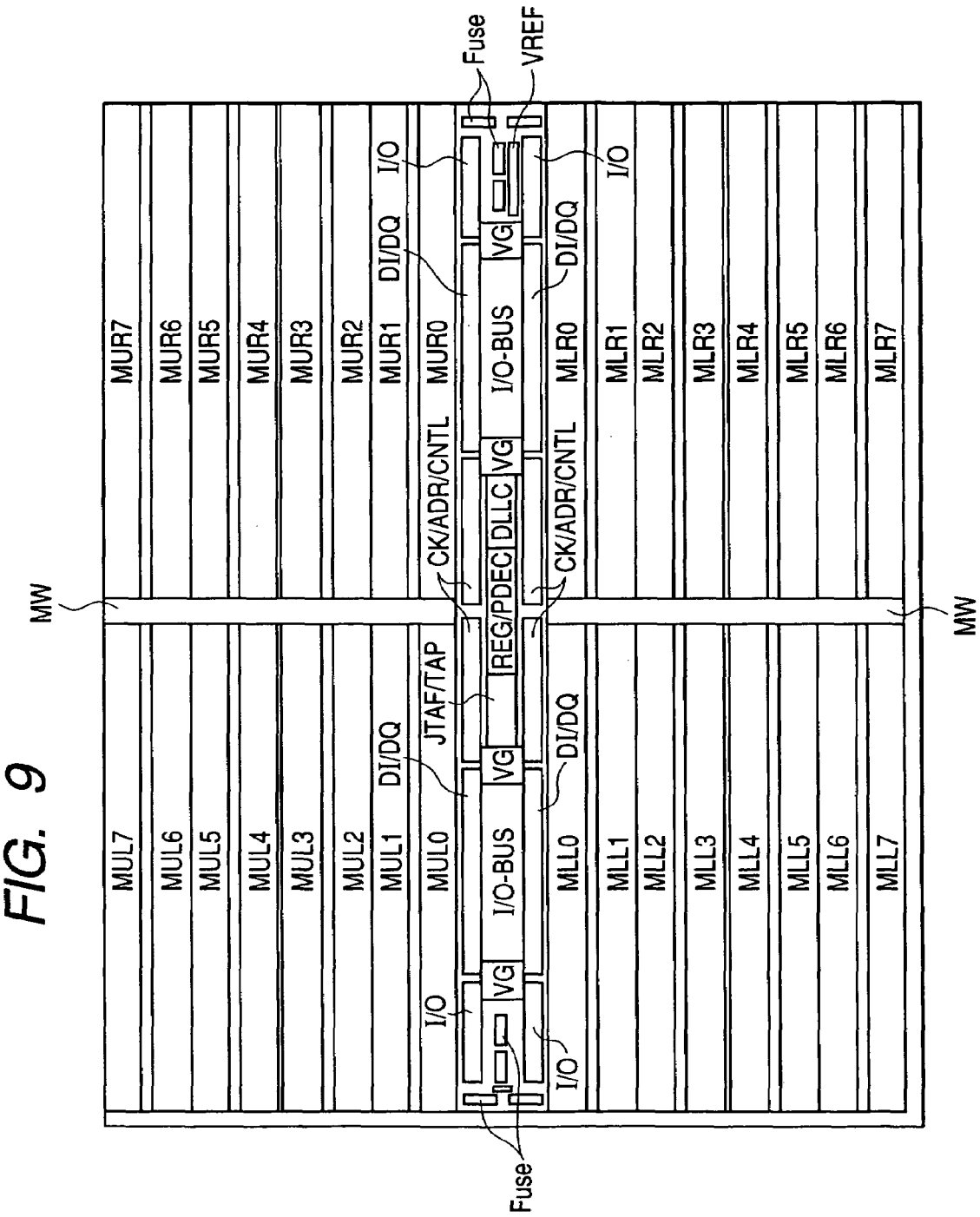
FIG. 9 is a chip layout diagram depicting a semiconductor memory.

A chip layout diagram of an embodiment of a semiconductor memory to which the present invention is applied is shown in FIG. 9. In the same drawing, MUL0 through MUL7, MUR0 through MUR7, MLL0 through MLL7 and MLR0 through MLR7 are respectively cell arrays in which memory cells are arranged in array form. MWD designates a main word driver. CK/ADR/CNTL indicate input circuits for clock signals, address signals, memory control signals or the like, DI/DQ indicate data input/output circuits, and I/O indicate input/output circuits for mode switching signals, test signals, DC signals or the like, respectively.

The semiconductor memory according to the present embodiment may use a center pad system. Therefore, the CK/ADR/CNTL circuits, DI/DQ circuits and I/O circuits are also placed in the center of a chip. Further, REG/RDEC designates a predecoder or the like, DLLC designates a clock synchronizing circuit, JTAG/TAP designates a test circuit, and VG indicate internal power supply voltage generating circuits, respectively. Fuse circuits are used for memory array relief or the like. VREF generates a reference voltage or the like for fetching an input signal therein. The above output buffer is placed in the DI/DQ section.

In the semiconductor integrated circuit device according to the present invention, a terminating circuit may be provided within the chip, and the impedance of the output buffer is matched with the characteristic impedance of a transmission line. Therefore, when the semiconductor integrated circuit device according to the present invention is mounted to a system, re-reflection noise can be absorbed by the above output impedance even when no terminating resistor is provided at an input terminal of a semiconductor integrated circuit device equivalent to the opposite party, which carries out signal transfer, thereby enabling data transfer at a high frequency. Alternatively, even when the output impedance of the opposite party that performs the signal transfer is not matched with the characteristic impedance of the transmission line, no reflection noise is produced by terminal circuit so that data transfer at a high frequency is enabled. Thus, since the semiconductor integrated circuit device according to the present invention enables high-speed data transfer without connecting the terminating resistor or the like, the miniaturization of an easy-to-use electronic equipment can be realized.

In the semiconductor memory of the center pad system as in the embodiment of FIG. 9, the data input/output circuits DI/DQ are provided as four pairs in the center of the chip in the vertical and horizontal directions. In addition, the input circuits CK/ADR/CNTL each requiring the terminal circuit are also provided as four pairs in the vertical and horizontal directions. When the circuits that perform these two types of impedance control are provided in distributed form upward and downward, as viewed in FIG. 9, there is a need to extend a number of wirings like 7×2 and 6×2 along the center pads as described above. Since the center of the chip corresponds to a crowded portion of wirings, a further increase in wiring for the above impedance control may occur.

Figure 10:
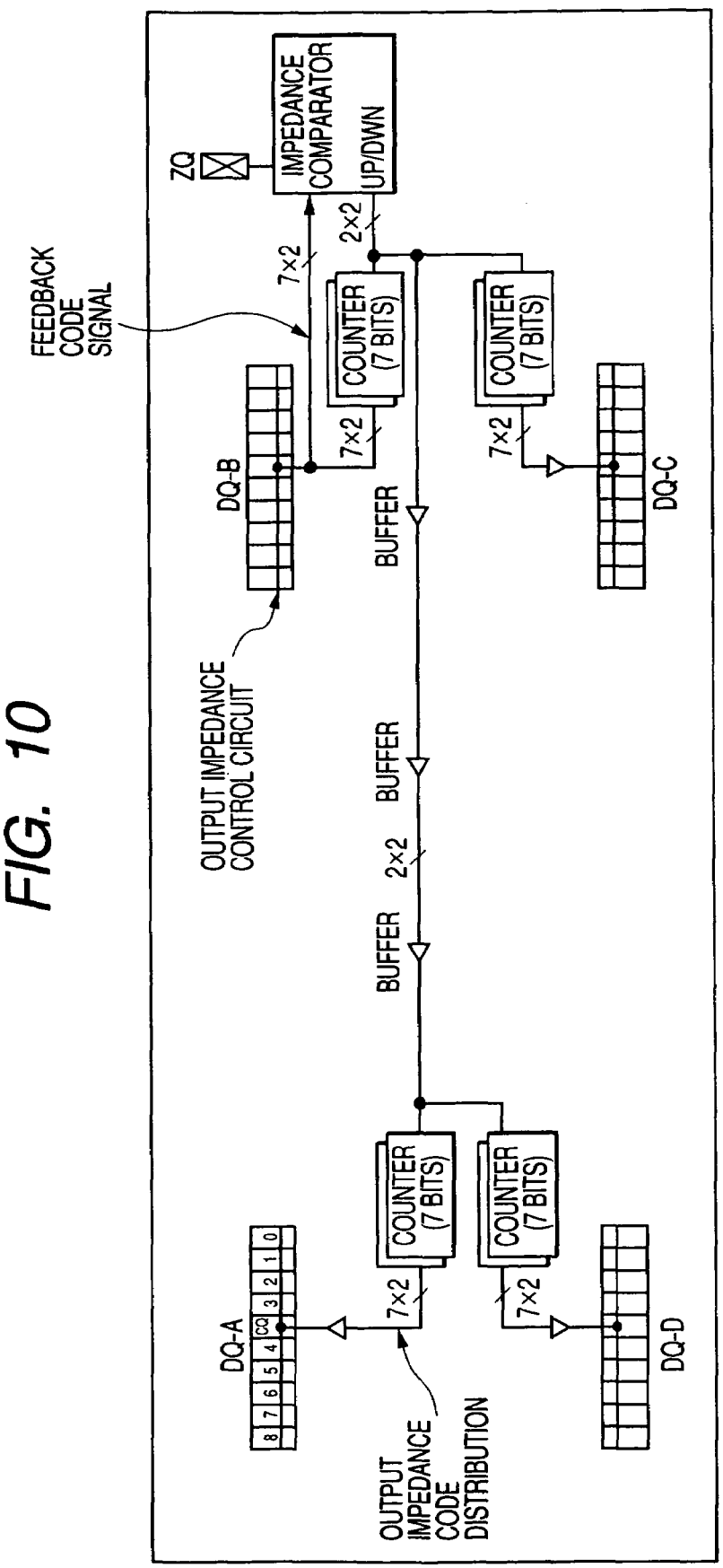
FIG. 10 is an overall block diagram showing output impedance control circuit of the semiconductor memory.

An overall block diagram of an embodiment of an output impedance adjustment or control circuit of the semiconductor memory according to the present invention is shown in FIG. 10. Output impedance control circuits and respective circuit blocks, such as an impedance comparator, counters, etc. used to constitute the impedance control circuits, are illustrated so as to substantially coincide with geometrical arrangements in a central portion corresponding to the center pad section of the semiconductor chip of FIG. 9. That is, four sets of output circuits (output impedance control circuits) DQ-A, DQ-B, DQ-C and DQ-D are provided. The respective sets of output circuits respectively include 10 output buffers having output data of 9 bits constituted of 0 to 8 and output strobe clocks CQ corresponding to these data outputs, and their impedance control circuits (including latches), as illustratively shown in the output circuit DQ-A.

In the chip floor plan of the semiconductor memory shown in FIG. 9, the above respective circuits are placed in the center as viewed in the longitudinal direction of the rectangular semiconductor chip, and the memory cell arrays are placed on both sides so as to interpose them therebetween. Upon distributing impedance codes to the respective output circuits provided in the central portion shown in FIG. 10 in an enlarged form, there is a need to make synchronism between the respective output circuits to switch (update) the codes in order to suppress variations in output impedance value between the output pins.

When the output circuits are disposed within the chip over a wide range, i.e., the output circuits are laid out over a wide range as each distribution delay of an impedance code signal becomes larger than the generation cycle of the impedance code signal, there may be cases in which the latest codes and previous codes exist in mixed form in association with the distribution delays according to the distances from the impedance comparator, and the impedance values appear to vary. As countermeasures, all the output impedances may be updated during the cycle in which each impedance code signal is generated.

When the impedance codes are distributed to the output circuits, a plurality of code holding latches are distributed and placed near the output circuits in overlapping form, and code synchronization is made by control clocks of such equal skews as is well known, whereby the same impedance code is provided between the output circuits at the far end/near end. That is, since the nearest end output circuit and the farthest end output circuit are synchronized by the control clocks of the equal skews and fetch the impedance code therein, variations in the output impedance value can be prevented.

In the present embodiment, the counters (7 bits) . are placed close to the respective output circuits and an up/down signal U/DWN formed by the impedance comparator, and distributed to the counters without directly supplying the impedance codes to the respective output circuits. The counters corresponding to the output circuits count the distributed up signal UP or down signal DWN, and respectively generate impedance codes and transmit them to the output circuits. Even in this case, the impedance codes generated by the counters are synchronized by control clocks of equal skews as described above and fetched into their corresponding latches. Therefore, even when a delay in distribution of the up/down signal U/DWN occurs, such a problem that the output impedance values appear to vary is avoided.

In such a configuration, the counters are provided as two sets to generate the respective impedance codes for P and N channels. Signal lines equivalent to 4=2×2 may be simply added to supply the up signal Up and the down signal DWN to the counters. Thus, the number of wirings can be greatly reduced as compared with the case in which the signal lines for transmitting the fourteen impedance codes are laid out. As described in the present embodiment, the embodiment has the feature that even when the impedance code is further increased to 8 bits or more, the signal supply can be done by the four signal lines alone in such a configuration that the up signal UP and the down signal DWN are distributed. Reducing the number of wirings that pass through the center of the chip in this way also enables a reduction in the probability of a cord-blown failure due to foreign materials and breaks with respect to the number of wirings.

Figure 11:
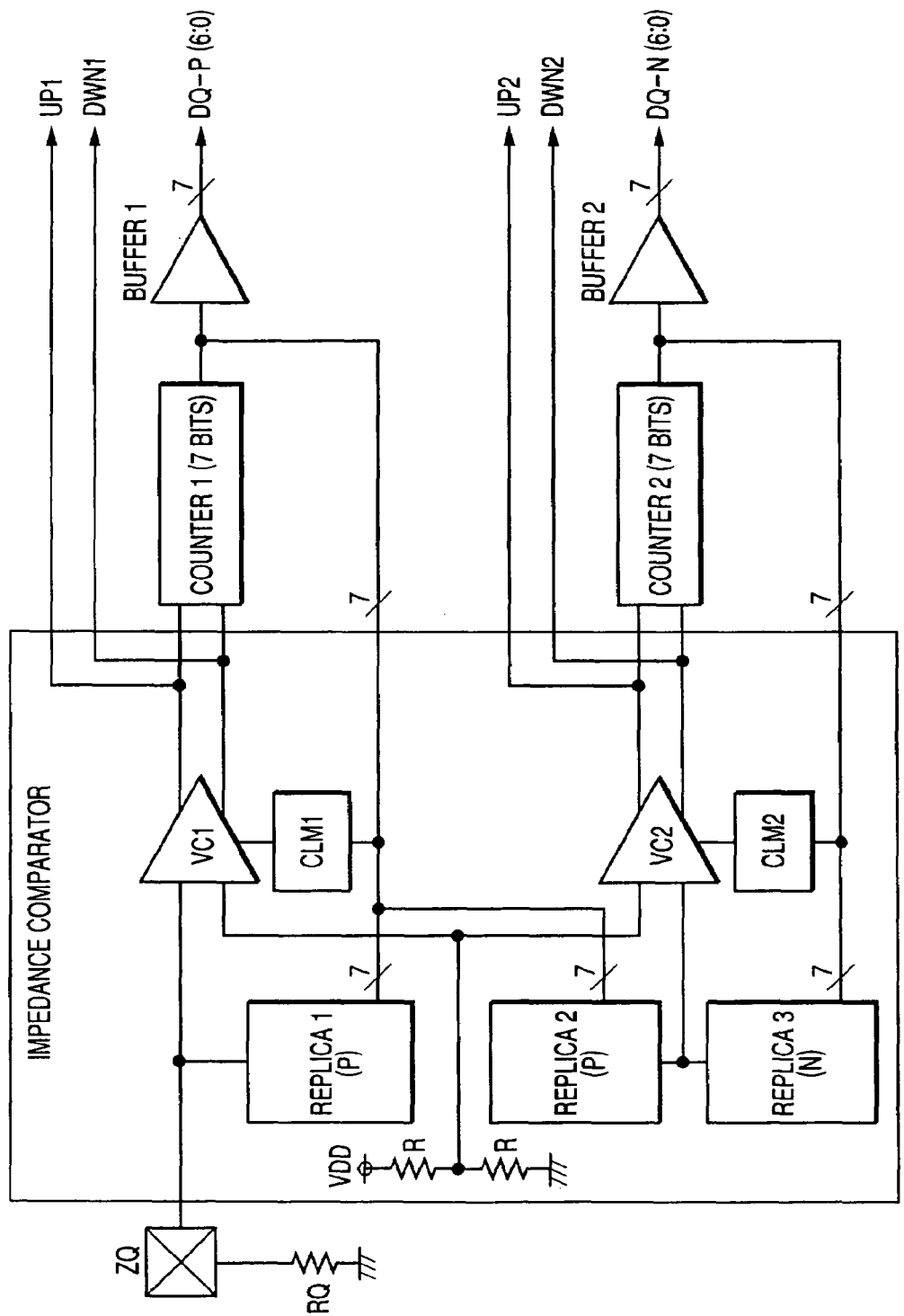
FIG. 11 is a block diagram illustrating an impedance comparator shown in FIG. 10.

A block diagram of one embodiment of the impedance comparator shown in FIG. 10 is shown in FIG. 11. The present embodiment is basically similar to the embodiment of FIG. 7. An external resistor RQ is connected to an external terminal ZQ. The external resistor RQ is connected in series with a replica 1. The replica 1 is a circuit corresponding to the output buffer 2 on the pull-up side shown in FIG. 3. A voltage divided by the resistor RQ and the replica 1 is compared with a reference voltage of VDD/2 formed by resistors R by means of a voltage comparator VC1 from which an up signal UP1 or a down signal DWN1 is formed and counted by a counter 1. The counted output is transmitted to the replica 1 as a feedback signal so that its impedance is controlled.

A replica 2 is set to the same configuration as the replica 1, and the impedance control is done based on the feedback signal. The replica 2 and the replica 3 are directly connected to each other. The replica 3 is a circuit corresponding to the output buffer 1 on the pull-down side shown in FIG. 3. A voltage divided by the replica 3 and replica 2 is compared with the reference voltage of VDD/2 formed by the resistors R by means of a voltage comparator VC2 from which an up signal UP2 or a down signal DWN2 is formed and counted by a counter 2. The counted output is transmitted to the replica 3 as a feedback signal so that its impedance is controlled.

As the counters 1 and 2 that transmit the feedback signals to the replicas 1, 2 and 3, the counters placed in the positions closest to the impedance comparator are used. In the embodiment shown in FIG. 10, the counters provided corresponding to the output impedance control circuit DQ-B are used to form the feedback signals supplied to the replicas 1 through 3 of the impedance comparator. In the present embodiment, code limiters CLM1 and CLM2 are provided. The code limiters CLM1 and CLM2 are provided to prevent the counter values from increasing to a constant value or more.

Figure 12:
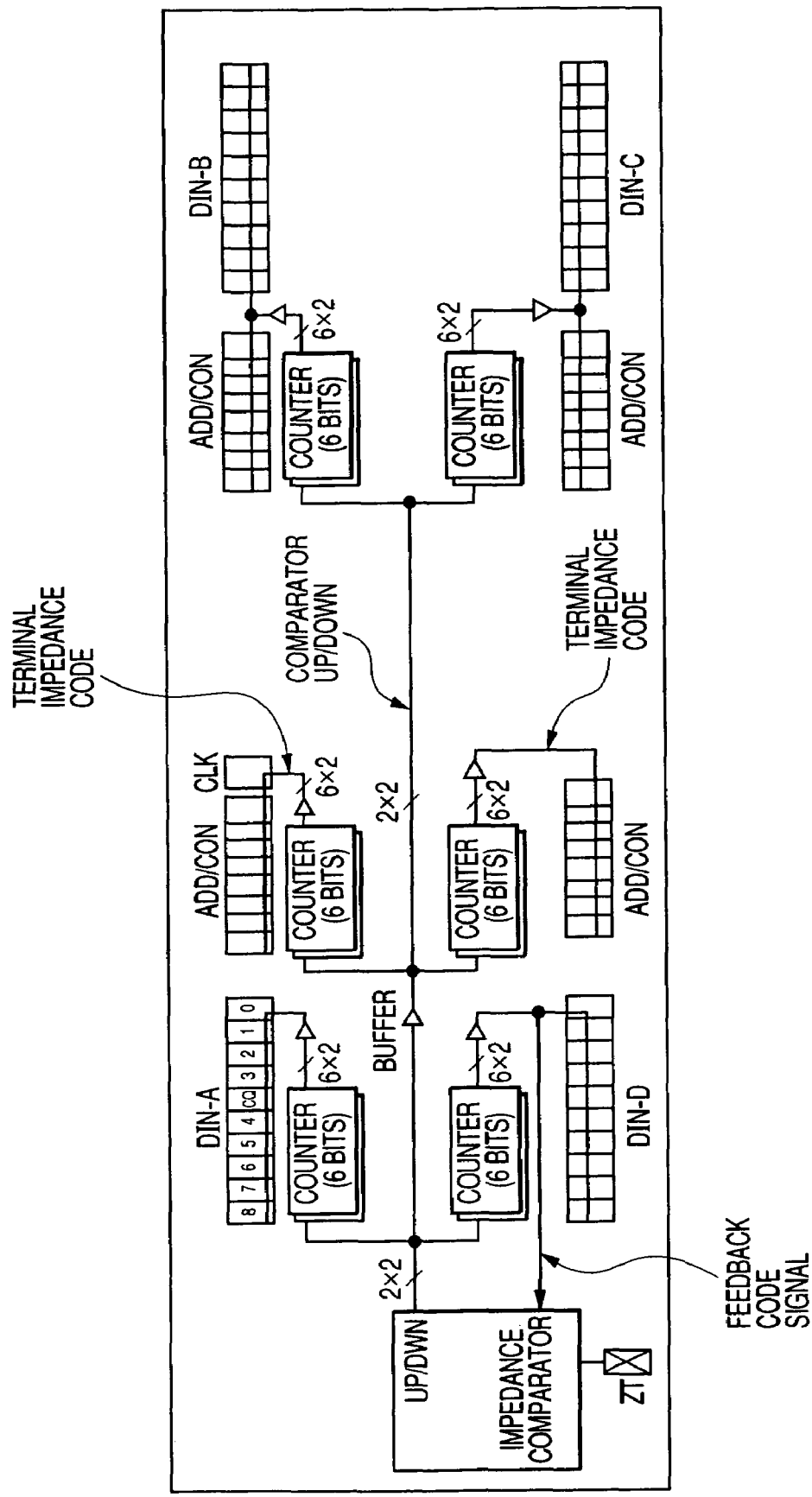
FIG. 12 is an overall block diagram depicting a terminal impedance control circuit of the semiconductor memory.

An overall block diagram of an embodiment of a terminal impedance adjustment or control circuit of the semiconductor memory according to the present invention is shown in FIG. 12. Terminal impedance control circuits and respective circuit blocks such as an impedance comparator, counters, etc. used to constitute the impedance control circuits, which are shown in the same drawing, are illustrated so as to substantially coincide with geometrical arrangements in a central portion corresponding to the center pad section over the semiconductor chip of FIG. 9. That is, terminating circuits corresponding to four sets of data inputs DIN-A through DIN-D, and terminating circuits corresponding to two sets of address/control ADD/CON and a clock CLK, are provided. Address/control ADD/CON are set to the data inputs DIN-B and DIN-C provided at the ends farthest away from the impedance comparator. The respective sets of terminating circuits include latches and impedance control circuits.

In the present embodiment, the counters (6 bits) are placed close to the respective terminating circuits and an up/down signal U/DWN formed by the impedance comparator, without directly supplying the terminal impedance codes to the respective terminating circuits. The counters corresponding to the terminating circuits count the distributed up signal UP or down signal DWN, and respectively generate terminal impedance codes and transmit them to the terminating circuits (impedance control circuits). The impedance codes generated by the counters are synchronized by control clocks of equal skews as described above and fetched into their corresponding latches. Therefore, even when a delay in distribution of the up/down signal U/DWN takes place, the problem that the output impedance values appear to vary is avoided.

Even in such a configuration, the counters are provided as two sets to generate the respective impedance codes for P and N channels in a manner similar to the output impedance control. Signal lines equivalent to 4=2×2 may be simply added to supply the up signal Up and the down signal DWN to the counters. Thus, the number of wirings can be greatly reduced as compared with the case in which the signal lines for transmitting the twelve impedance codes are laid out. As described in the present embodiment, the embodiment has the feature that even when the impedance code is further increased to 7 bits or more, the signal supply can be done by the four signal lines alone in such a configuration that the up signal UP and the down signal DWN are distributed.

In the present embodiment, the terminating circuit corresponding to the address/control ADD/CON and the clock CLK provided in the center may be controlled using the terminal impedance codes formed by the counters provided on both sides. When such a configuration is adopted, the counters provided in the center can be omitted. In the present configuration, the terminating circuit provided in the center is divided into two, which in turn may be shared from both sides and supplied with a terminal impedance code formed by any one of the counters aside from the supply of the terminal impedance codes. Although the terminal impedance codes formed by the counters are supplied to the corresponding terminating circuits as they are in the present embodiment, it is needless to say that the code shift circuits may be provided as in the embodiment of FIG. 7 so as to generate the terminal impedance codes to be supplied to their corresponding terminating circuits.

Figure 13:
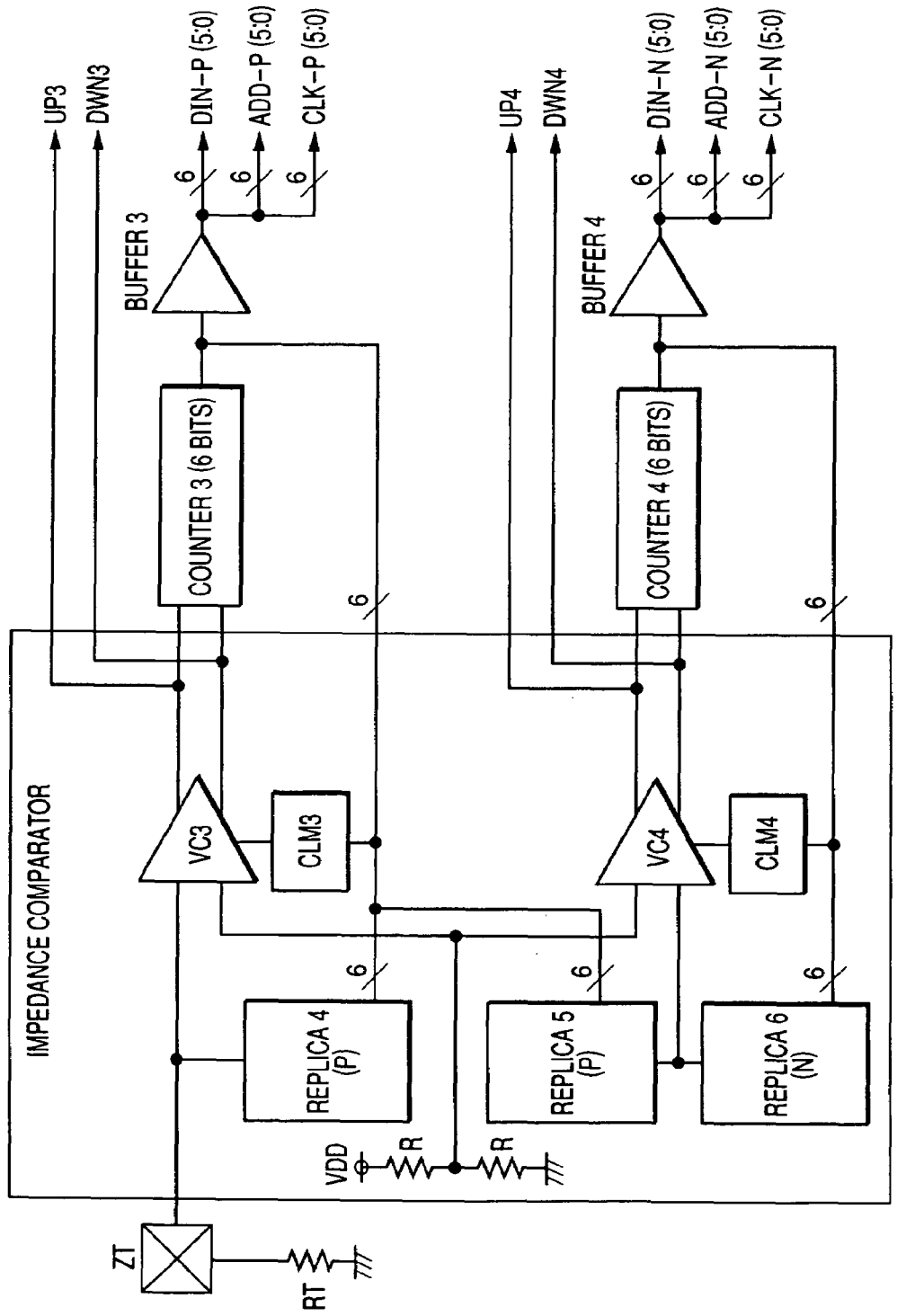
FIG. 13 is a block diagram showing an impedance comparator shown in FIG. 12.

A block diagram of an embodiment of the impedance comparator shown in FIG. 12 is shown in FIG. 13. The present embodiment is similar to the embodiment shown in FIG. 7. An external resistor RT is connected to an external terminal ZT. The external resistor RT and a replica 4 are connected in series. The replica 4 is a circuit corresponding to each of the pull-up terminating resistors 402 shown in FIG. 7. A voltage divided by the resistor RT and the replica 4 is compared with a reference voltage of VDD/2 formed by resistors R, by means of a voltage comparator VC3 from which an up signal UP3 or a down signal DWN3 is formed and counted by a counter 3. The counted output is transmitted to the replica 4 as a feedback signal so that its impedance is controlled.

A replica 5 is set to the same configuration as the replica 4, and the impedance control is done based on the feedback signal. The replica 5 and a replica 6 are directly connected to each other. The replica 6 is a circuit corresponding to each of the pull-down terminating resistors 403 shown in FIG. 7. A voltage divided by the replica 6 and replica 5 is compared with the reference voltage of VDD/2 formed by the resistors R by means of a voltage comparator VC4 from which an up signal UP4 or a down signal DWN4 is formed and counted by a counter 4. The counted output is transmitted to the replica 6 as a feedback signal so that its impedance is controlled.

As are the counters 3 and 4 that transmit the feedback signals to the replicas 4, 5 and 6, the counters placed in the positions closest to the impedance comparator are used. In the embodiment shown in FIG. 12, the counters provided corresponding to the terminating circuit DIN-D are used as ones which form the feedback signals supplied to the replicas 4 through 6 of the impedance comparator. In the present embodiment, code limiters CLM3 and CLM4 are provided. The code limiters CLM3 and CLM4 are provided to prevent the counter values from increasing or decreasing to a constant value or more. As described in the embodiment of FIG. 7, the code shift circuits may be provided at the output parts of the counters 3 and 4 to generate terminal impedance codes to be supplied to their corresponding terminating circuits.

Figure 14:
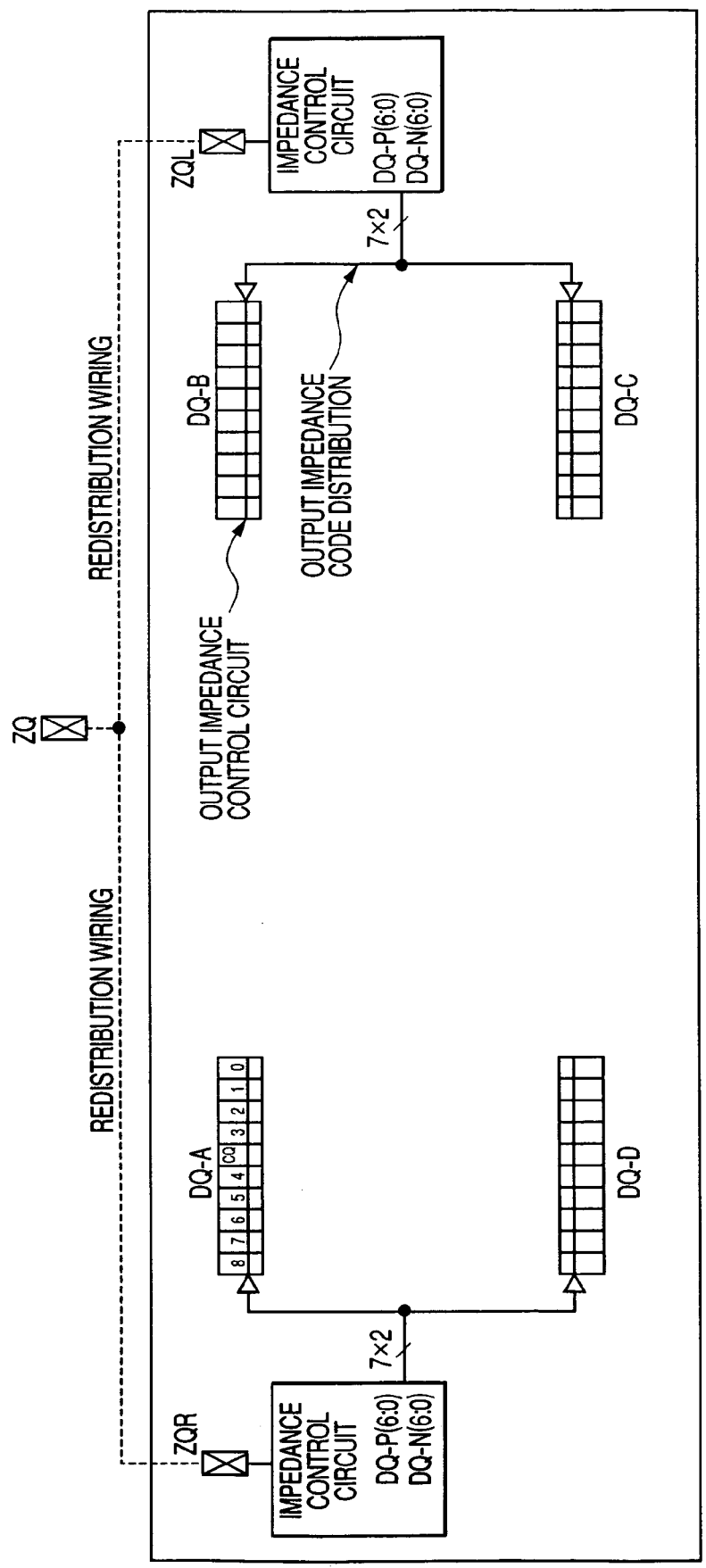
FIG. 14 is an overall block diagram illustrating the output impedance control circuit of the semiconductor memory.

An overall block diagram of an embodiment of the output impedance adjustment or control circuit of the semiconductor memory according to the present invention is shown in FIG. 14. Output impedance control circuits and respective circuit blocks, such as impedance comparators, counters, etc. used to constitute the impedance control circuits, all of which are shown in the same drawing, are illustrated so as to substantially coincide with geometrical arrangements in a central portion corresponding to the center pad section over the semiconductor chip of FIG. 9.

In the present embodiment, the impedance control circuits are provided at both ends of the chip central portion in order to avoid a substantial problem of output impedance code distribution wirings. In other words, the formation of the output impedance code distribution wirings in the chip central portion where the wirings are crowded. Four sets of output circuits (output impedance control circuits) DQ-A, DQ-B, DQ-C and DQ-D are divided into the output circuits DQ-A and DQ-D placed on the lower left side in the same drawing and the output circuits DQ-B and DQ-C placed on the upper right side in the same drawing.

The impedance control circuits are respectively provided corresponding to the two sets of output circuits DQ-A and DQ-D and DQ-B and DQ-C. These two impedance control circuits respectively include the impedance comparators and counters shown in FIG. 10. Therefore, wirings for output impedance code distribution, which are equivalent to 7×2=14, are provided so as to extend from the impedance control circuits to the respective output circuits (output impedance control circuits). However, these wirings are not such wirings as to cross over the chip central portion inclusive of the chip central portion.

Pads ZQR and ZQL are provided corresponding to the two impedance control circuits. These pads ZQR and ZQL are interconnected with each other by redistribution wirings indicated by dotted lines in the same drawing. A bump electrode ZQ used as an external terminal is provided with respect to such redistribution wirings. The redistribution wirings are provided in a flip-chip type semiconductor integrated circuit device, for example. In the present flip-chip type semiconductor integrated circuit device, for example, redistribution wirings are routed form bonding pads of its chip, bump electrodes connected to the redistribution wirings are disposed over the surface of the chip in the form of an array (area array), and the bump electrodes disposed in such an area array form are exposed from a surface protective film.

Thus, the flip-chip type semiconductor integrated circuit device is used to facilitate the substrate packaging such that the interval between the adjacent bump electrodes is enlarged and the bump electrodes are connected to their corresponding wirings of a printed circuit board, and so as to enable the use of a mounting board wide in wiring interval and low in cost. In such a flip-chip type semiconductor integrated circuit device, the bump electrodes are terminals directly connected to the printed circuit board, only the bump electrodes are exposed, and the bonding pads of the semiconductor chip are covered with an insulating film or a protective film. Therefore, the bump electrodes correspond to external connecting terminals such as lead pins of a package such as QFP.

In the semiconductor integrated circuit device of the present embodiment, such circuit elements. and wirings as described above are formed over one main surface side of the semiconductor chip. Pads ZQL and ZQR are formed by wirings placed in the top layer, of the wirings. An organic insulating film corresponding to a first layer is formed except for openings of the pads ZQL and ZQR. The organic insulating film is constituted of polyimide, for example. A redistribution wiring layer is provided as a conductive layer, which electrically connects between the two pads ZQL and ZQR formed over the main surface side of the semiconductor chip, and is formed over the organic insulating film corresponding to the first layer formed of the polyimide. An organic insulating film corresponding to a second layer is formed, except for an opening where a bump electrode is formed, of the surface of such a redistribution wiring layer. The bump electrode is used as the external terminal ZQ.

Figure 15:
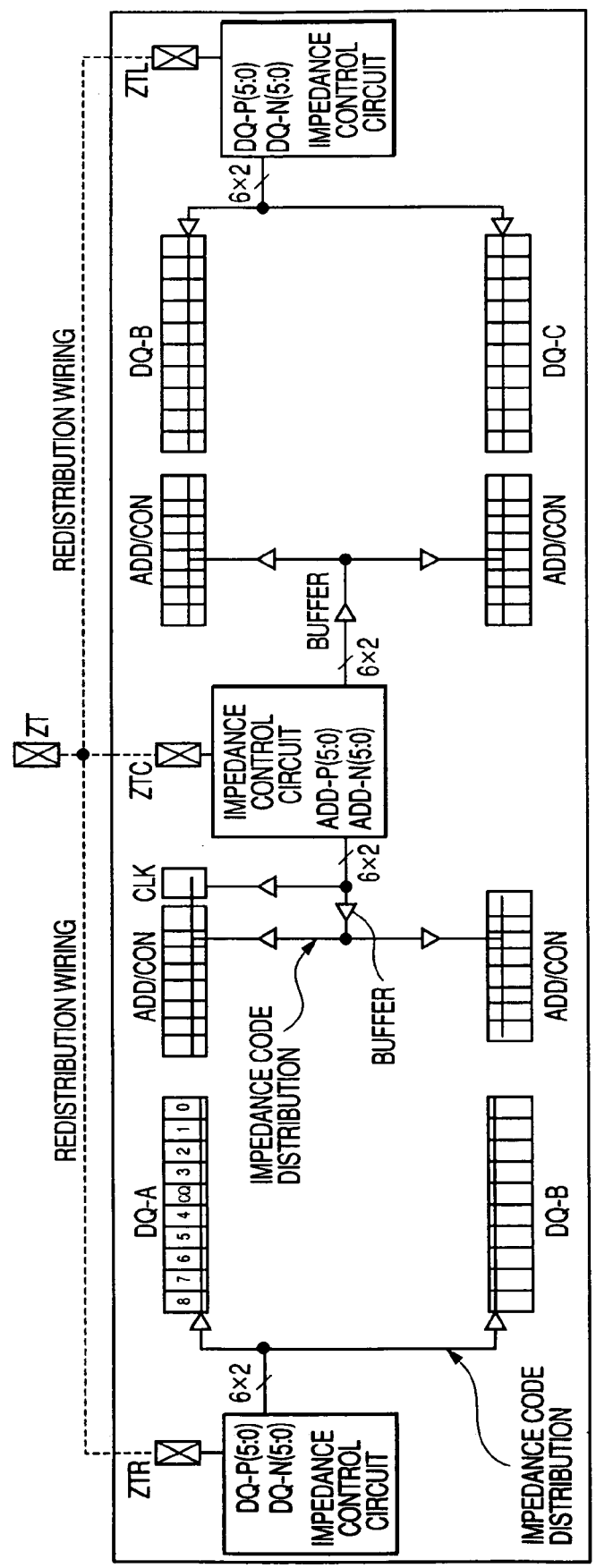
FIG. 15 is an overall block diagram depicting the terminal impedance control circuit of the semiconductor memory.

An overall block diagram showing an embodiment of the terminal impedance adjustment or control circuit of the semiconductor memory according to the present invention is shown in FIG. 15. The present embodiment shows a modification of FIG. 12. Four sets of terminating circuits corresponding to the four sets of data inputs DIN-A through DIN-D, and a terminating circuit corresponding to the four sets of address/control ADD/CON and one clock CLK, are divided into two groups as viewed in the vertical and horizontal directions and respectively provided with impedance control circuits. A terminating circuit corresponding to four sets of address/control ADD/CON and one clock CLK placed on the left side near the center of a chip is configured as one group and provided with an impedance control circuit.

Each of these three impedance control circuits includes the impedance comparator and counters shown in FIG. 13. Therefore, wirings for impedance code distribution, which are equivalent to 6×2=12, are provided so as to extend from the impedance control circuits to the respective output circuits (terminal impedance control circuits). However, these wirings are not such wirings as to cross over the chip central portion inclusive of the chip central portion. Pads ZTR, ZTL and ZTC are provided corresponding to the three impedance control circuits. These pads ZTR, ZTL and ZTC are interconnected with one another by redistribution wirings indicated by dotted lines in the same drawing in a manner similar to the embodiment of FIG. 14. A bump electrode ZT used as an external terminal is provided with respect to such redistribution wirings.

In the present embodiment, the terminating circuit corresponding to the address/control ADD/CON and the clock CLK provided in the center may be controlled using impedance codes formed by the impedance control circuits provided on both sides. When such a configuration is adopted, the impedance control circuit provided in the center, and the pad ZTC corresponding to it, can be omitted. The terminating circuit provided in the center is divided into two, which in turn may be shared by the impedance control circuits provided on both sides and supplied with an impedance code formed by any one of the impedance control circuits aside from the supply of the terminal impedance codes.

Figure 16:
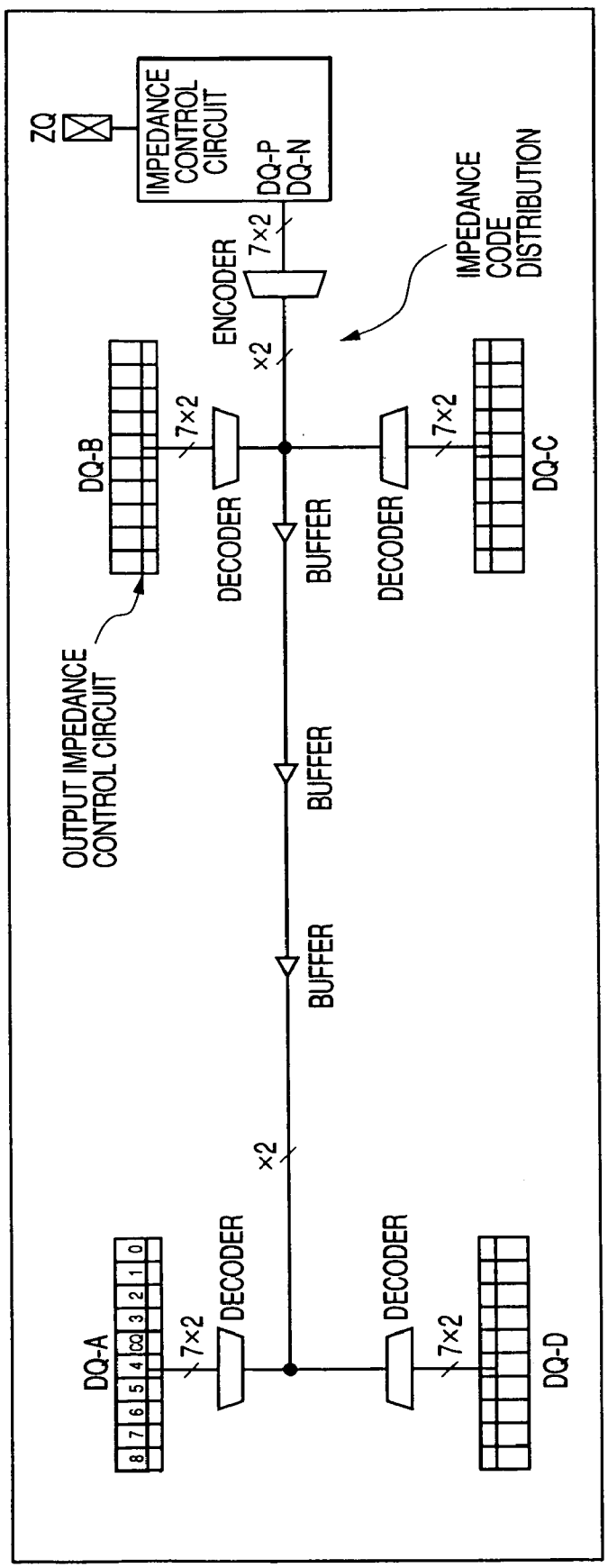
FIG. 16 is an overall block diagram showing the output impedance control circuit of the semiconductor memory.

An overall block diagram showing an embodiment of the output impedance adjustment or control circuit of the semiconductor memory according to the present invention is shown in FIG. 16. Output impedance control circuits and respective circuit blocks such as impedance comparators, counters, etc. used to constitute the impedance control circuits, all of which are shown in the same drawing, are illustrated so as to substantially coincide with geometrical arrangements in a central portion corresponding to the center pad section over the semiconductor chip of FIG. 9.

In the present embodiment, codes set 7 bits by 7 bits, for P and N channels, which are formed by such an impedance control circuit as shown in FIG. 14, are converted into serial data by an encoder, followed by transmission to decoders provided in association with four sets of output circuits (output impedance control circuits) DQ-A, DQ-B, DQ-C and DQ-D through two impedance distributing wirings. The respective decoders convert the serial data to parallel data set in groups of 7 bits, for P and N channels, followed by being transmitted to the impedance control circuit.

Figure 17:
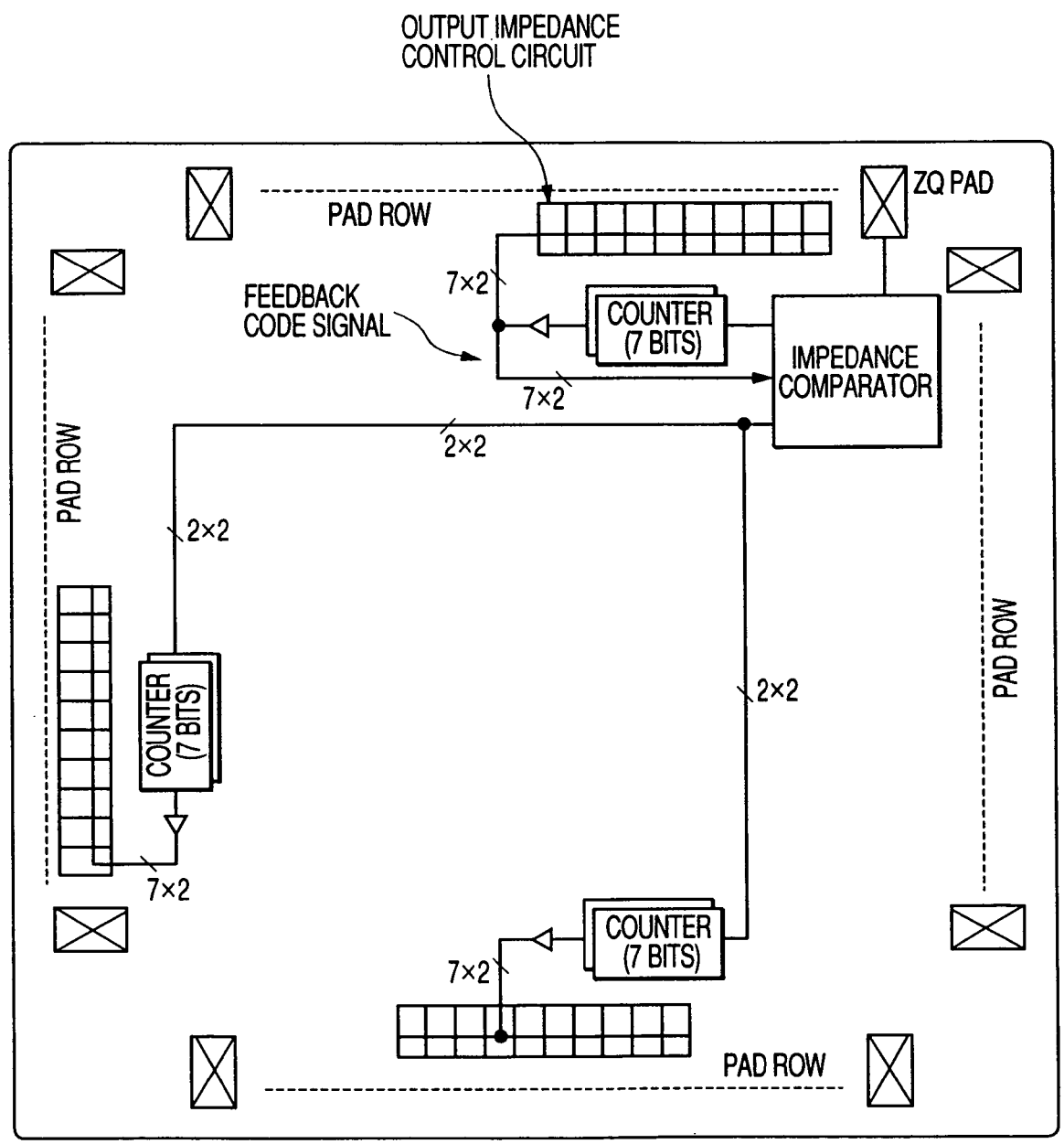
FIG. 17 is an overall block diagram illustrating an output impedance control circuit of a semiconductor integrated circuit.

An overall block diagram illustrating an embodiment of an output impedance adjustment or control circuit of a semiconductor integrated circuit device according to the present. invention is shown in FIG. 17. Although not restricted, the present embodiment is intended for a semiconductor integrated circuit device like a microprocessor or the like. Output circuits (output impedance control circuits) are provided corresponding to peripheral pads placed over a semiconductor chip constitutive of the microprocessor or the like. Counters are provided in association with three sets of output circuits (output impedance control circuits) illustratively shown in the same drawing.

In the present embodiment, the impedance codes is not directly supplied to the respective output circuits, the counters (7 bits) are placed close to the respective output circuits as described above, and an up/down signal U/DWN formed by an impedance comparator is distributed to the counters. The counters corresponding to the output circuits count the distributed up signal UP or down signal DWN, and respectively generate impedance codes and transmit them to the corresponding output circuits. In such a configuration, the counters are provided as two sets to generate the respective impedance codes for P and N channels. Signal lines equivalent to 2×2=4 may be simply added to supply the up signal Up and the down signal DWN to the counters. Thus, the number of wirings can be greatly reduced as compared with the case in which the signal lines for transmitting the fourteen impedance codes are laid out.

Figure 18:
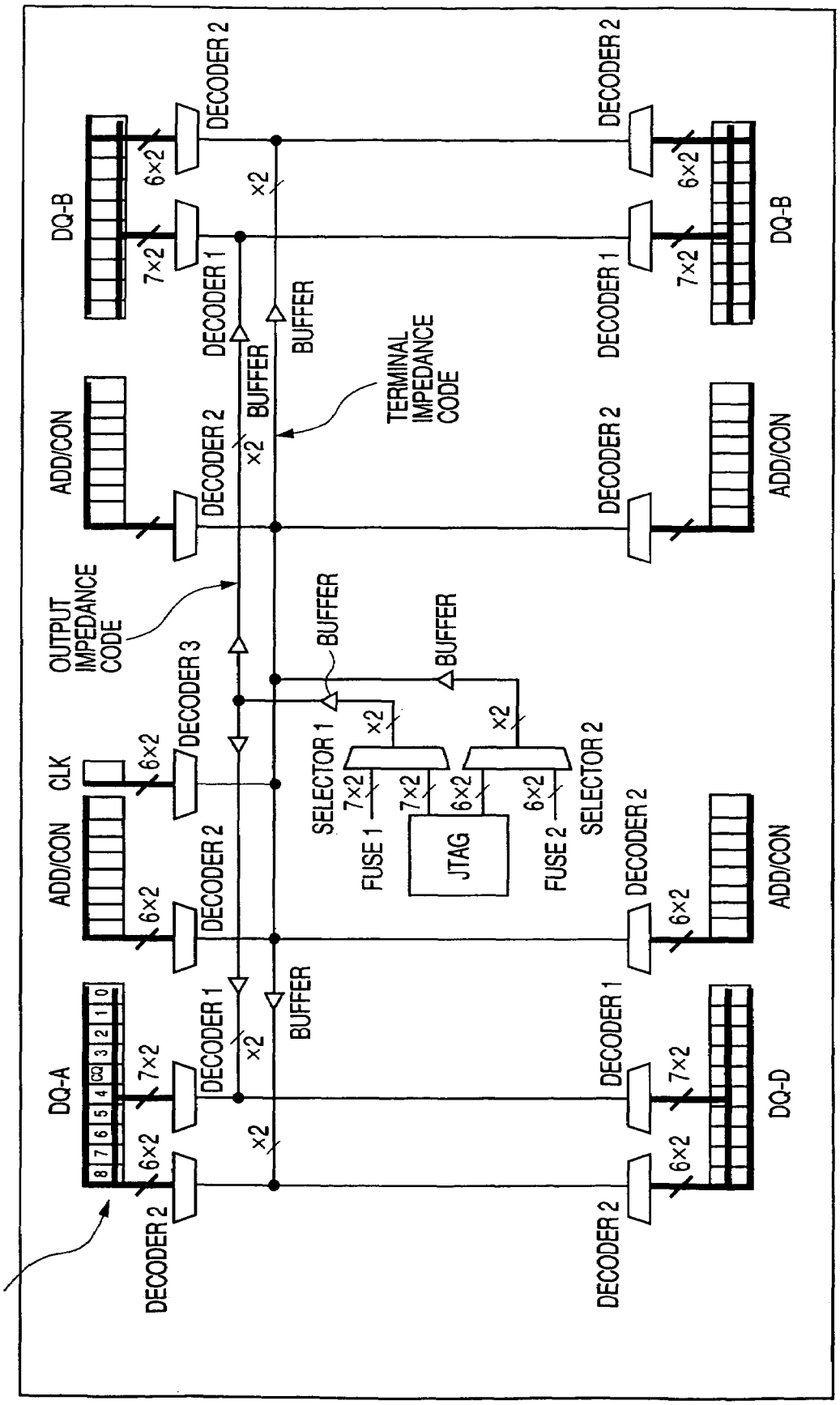
FIG. 18 is an overall block diagram depicting the impedance control circuit of the semiconductor memory.

An overall block diagram showing an embodiment of the impedance adjustment or control circuit of the semiconductor memory according to the present invention is shown in FIG. 18. Output impedance control and terminal impedance control are shown together in the present embodiment. In the present embodiment, impedance codes are set by internally provided fuses FUSE1 and FUSE2 as an alternative to the resistive elements RQ and RT connected to the external terminals as described above. JTAG is used to set the impedance codes to the optimum ones. A large number of wirings, like 7×2 and 6×2 connected to input/output impedance control circuits and output through rate control circuits, are represented by bold lines in FIG. 18 and FIG. 19, and they are similar to those employed in the embodiments shown in FIG. 10.

A test mode is set and an output impedance control code and a terminal impedance control code are inputted from test terminals. While the output impedance and the terminal impedance are being measured by a suitable measuring circuit or the like, the output impedance control code and the terminal impedance control code from which desired output and terminal impedances are obtained are detected, and correspondingly the fuses FUSE1 and FUSE2 are cut off.

A selector 1 performs switching between the output impedance control code, set by JTAG, and the output impedance control code set to the fuse FUSE1, and an encode operation as described above converts codes set in groups of 7 bits, which are intended for P and N channels, into serial data, and transmits the serial data to decoders 1 provided corresponding to four sets of output circuits (output impedance control circuits) DQ-A, DQ-B, DQ-C and DQ-D, through two impedance code distributing wirings. The decoders 1 respectively convert the serial data to a parallel data set in groups of 7 bits, which are intended for P and N channels, to set the output impedance.

A selector 2 performs switching between the terminal impedance control code set by JTAG and the terminal impedance control code set to the fuse FUSE2, and by an encode operation as described above are converted codes set in groups of 6 bits, which are intended for P and N channels, into serial data, and transmits the serial data to decoders 2 provided corresponding to eight sets of input circuits (terminal impedance control circuits) DQ-A, DQ-B, DQ-C, DQ-D, ADD/CON and one clock input circuit CLK, through two impedance code distributing wirings. The decoders 2 respectively convert the serial data to parallel data set in groups of 6 bits, which are intended for P and N channels, to set the output impedance.

Figure 19:
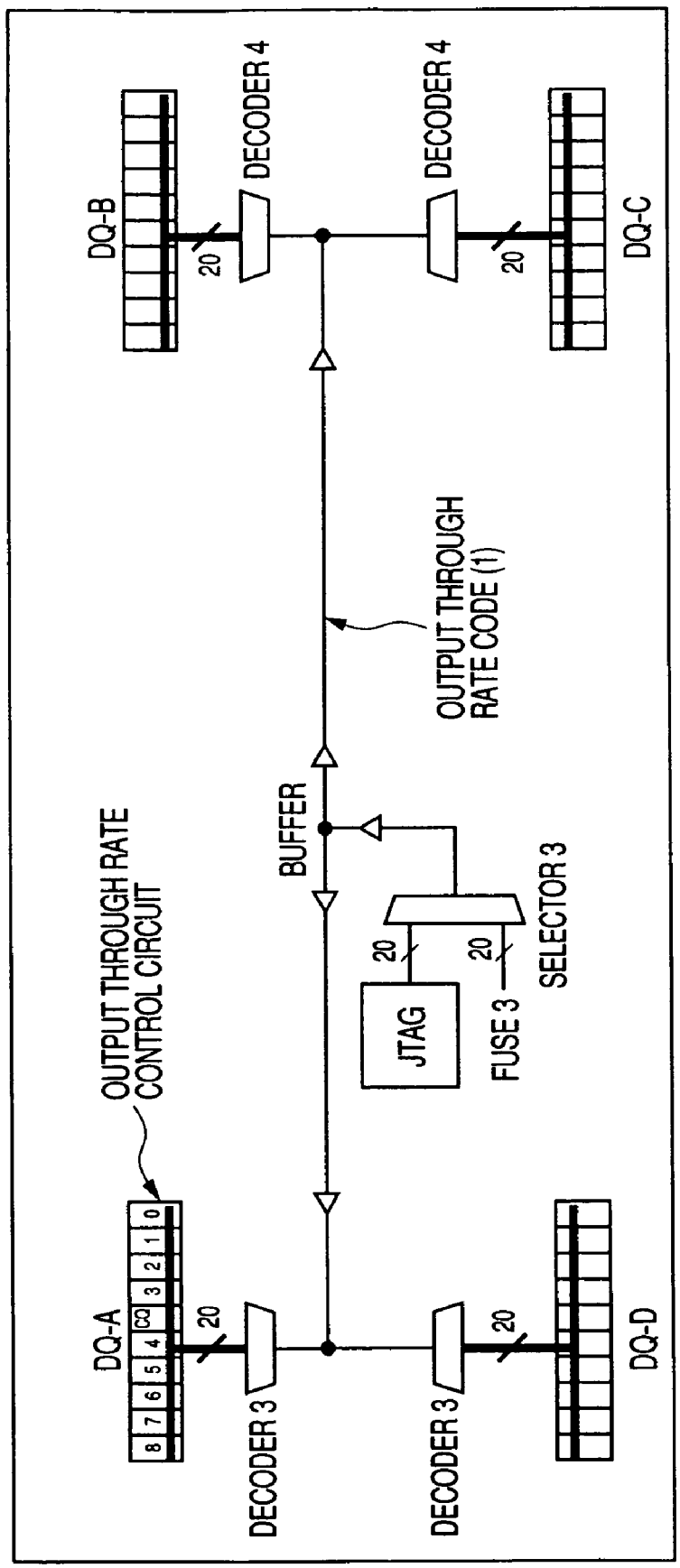
FIG. 19 is an overall block diagram showing a through rate control circuit of the semiconductor memory.

An overall block diagram showing an embodiment of a through rate control circuit of the semiconductor memory according to the present invention is shown in FIG. 19. In the present embodiment, JTAG is utilized in a manner similar to the embodiment of FIG. 18 to set a through rate to optimum. A test mode is set and a through rate control code is inputted from a test terminal. While the through rate is being measured by a suitable measuring circuit or the like, the output through rate control code from which a desired through rate is obtained is detected, and correspondingly a fuse FUSE3 is cut off.

A selector 3 performs switching between the through rate control code set via JTAG, and the through rate control code set to the fuse FUSE3, and such an encode operation as described above converts codes of 20 bits in total of the through codes JSR<0> through <18>, as described in FIG. 6, and an enable signal, into serial data, and transmits the serial data to decoders 4 provided corresponding to four sets of output circuits (output impedance control circuits) DQ-A, DQ-B, DQ-C and DQ-D, through one through rate code distributing wiring. The decoders 4 respectively convert the serial data to parallel data of 20 bits to set the output through rate.

Figure 20:
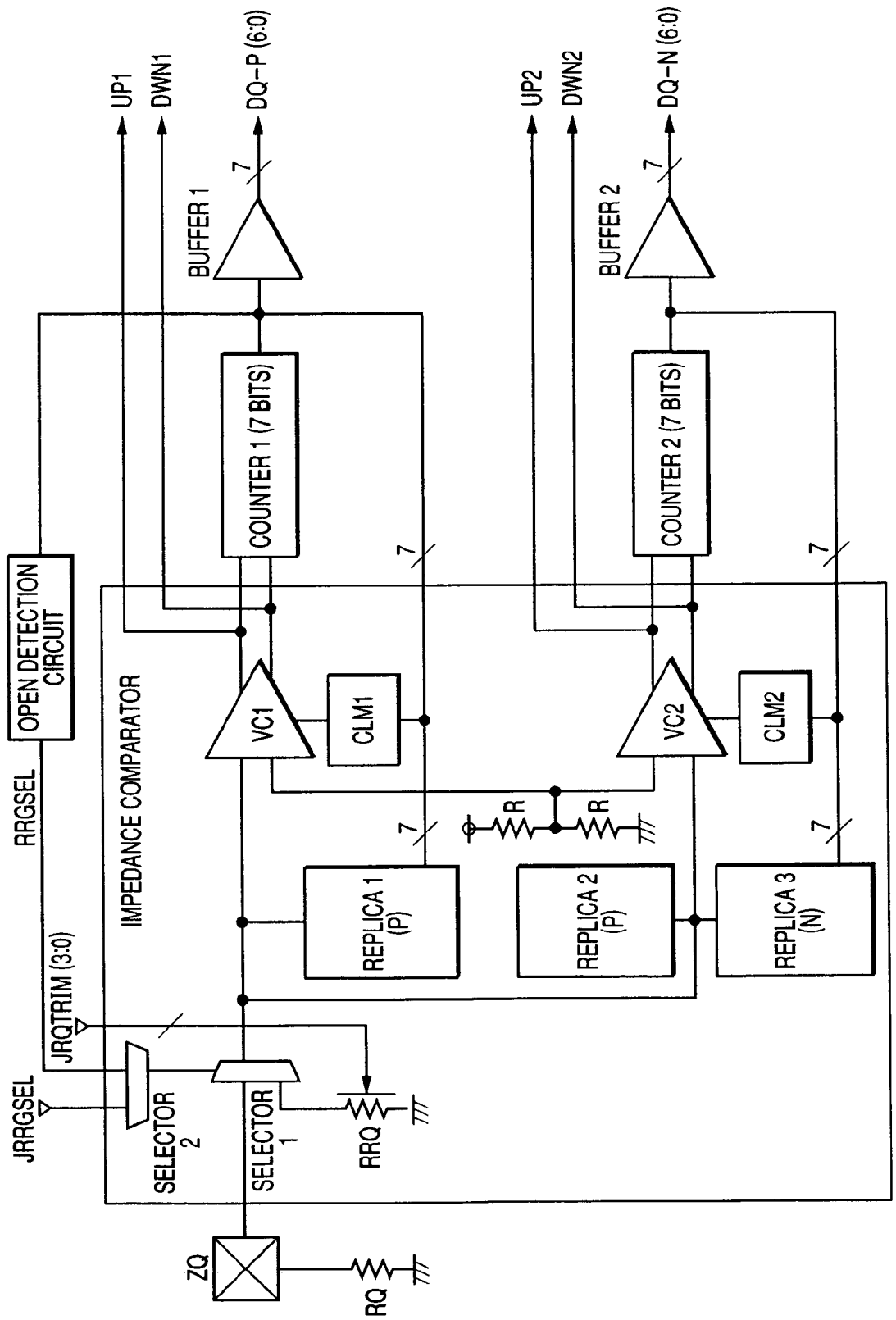
FIG. 20 is a block diagram illustrating the impedance comparator.

A block diagram illustrating an embodiment of the impedance comparator is shown in FIG. 20. In the present embodiment, a resistive element RQ is connected to an external terminal as described above, and an internally formed resistor RRQ is selectively used. The above JTAG is used for this selecting operation and to set the resistance value of the internal resistor RRQ. A selector 1 is controlled based on a control signal JRRGSREL sent from JTAG to thereby perform switching between the external resistor RQ and the internal resistor RRQ.

For example, the high impedance of a terminal ZQ is detected by an open detection circuit to form a control signal RRGSEL as an alternative to the use of the signal JRRGSEL. The selector 1 is controlled based on the control signal to perform switching for use between the external resistor RQ and the internal resistor RRQ. Therefore, a selector 2 is provided to select either the use of the control signal JRRGSEL sent from the above JTAG, or the use of the control signal RRGSEL formed by the open detection circuit. The selector 2 can take various embodiments such as one in which any one signal is selected according to a mask or the like at manufacture, one in which any one is selected according to cutting off of a fuse, or one in which any one is supplied from an external terminal, etc.

As shown in the same drawing, the open detection circuit can include a circuit that detects a count output of a counter 1 as a count value corresponding to the maximum value of a replica 1. That is, a voltage comparator VC1 increases the resistance value of the replica 1 in a state (high impedance state) in which the external terminal RQ is not connected to the external terminal ZQ, and continues to output an up signal UP such that the mid-voltage VDD/2 is reached. Therefore, the maximum value is reached. In the present configuration, the output impedance is automatically adjusted or controlled corresponding to the resistor RRQ provided in an internal circuit in the state in which no external resistor RQ is connected to the terminal ZQ.

A 4-bit signal JRQTRIM (n4:0) supplied from JTAG, for example, is supplied to set the resistance value of the internal resistor RRQ. The signal JRQTRIM (n4:0) serves so as to detect such a code that a desired resistance value is obtained from a resistance value set code inputted via JTAG in a manner similar to the case of the output impedance control and the terminal impedance control shown in FIG. 18. The present embodiment is similar in configuration to the embodiment shown in FIG. 11.

Figure 21:
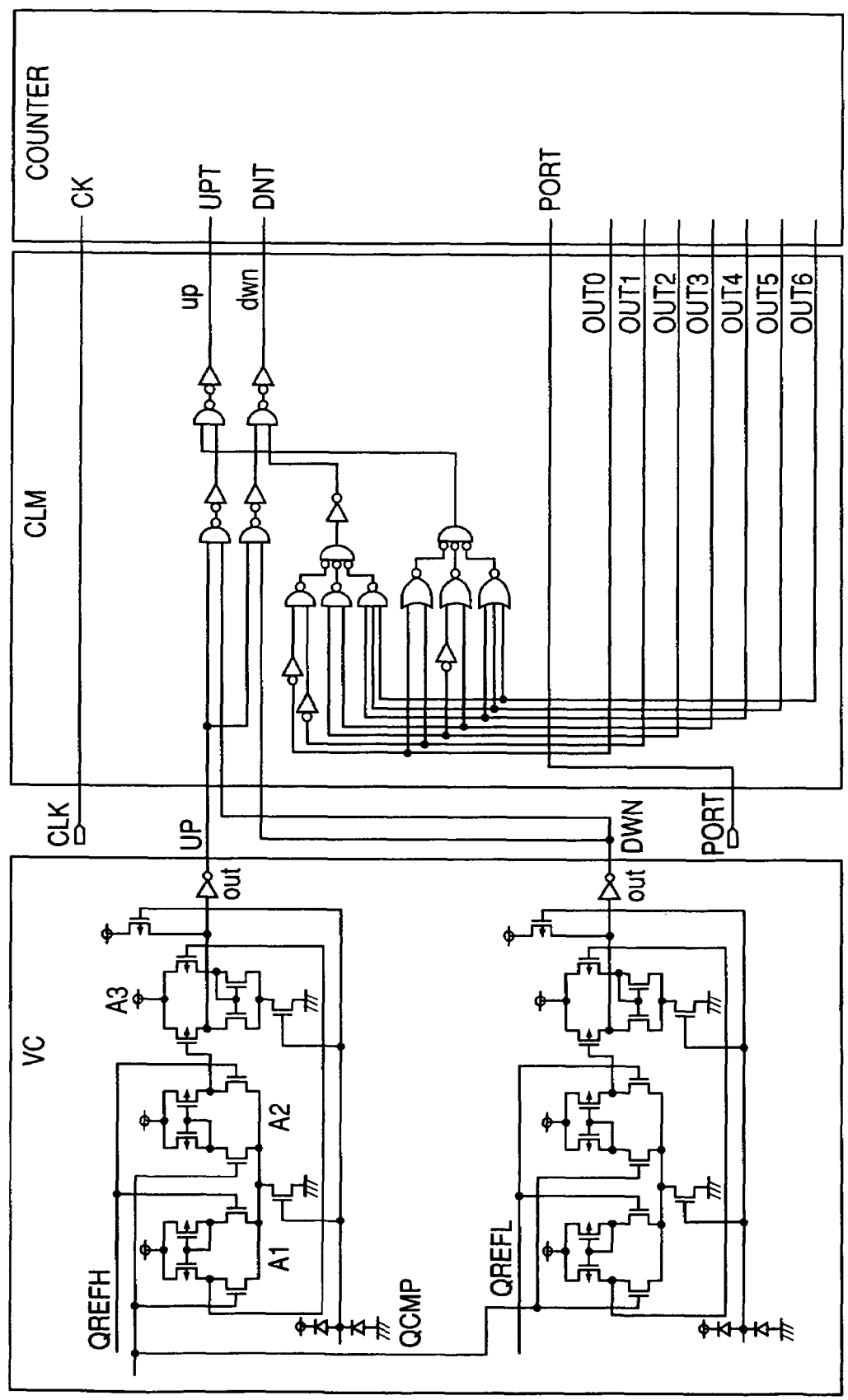
FIG. 21 is a circuit diagram depicting a voltage comparator and a limiter CLM.

A circuit diagram showing an embodiment illustrative of a voltage comparator VC and a limiter CLM is shown in FIG. 21. The voltage comparator VC includes a circuit that outputs an up signal UP from an output terminal out, and a circuit that outputs a down signal DWN from an output terminal out. These circuits are configured similarly to each other. As illustratively shown in the circuit for forming the up signal, a differential output obtained from single-end differential amplifier circuits A1 and A2 using N channel type differential MOSFETs is inputted to a single-end differential amplifier circuit A3 using P channel type differential MOSFETs, to thereby form an output signal UP. Such two voltage comparison circuits each having the differential amplifier circuits A1 through A3 share the use of an input terminal QCMP supplied with a division voltage. Division voltages formed by such replicas as described above are respectively supplied to the circuit for forming the up signal UP and the circuit for forming the down signal DWN.

The limiter CLM receives an output signal delivered from a counter at a gate circuit, and inhibits the transmission of the down signal DWN to the corresponding counter when the count value of the counter reaches less than or equal to a predetermined minimum value, and inhibits the transmission of the up signal UP to the corresponding counter when the count value reaches less than or equal to a predetermined maximum value, thereby limiting each impedance control code so as to fall within a predetermined value. The limiter CLM can be shared with the open detection circuit. That is, a signal for controlling the transmission of the up signal UP can be used as an open detection signal.

Figure 22:
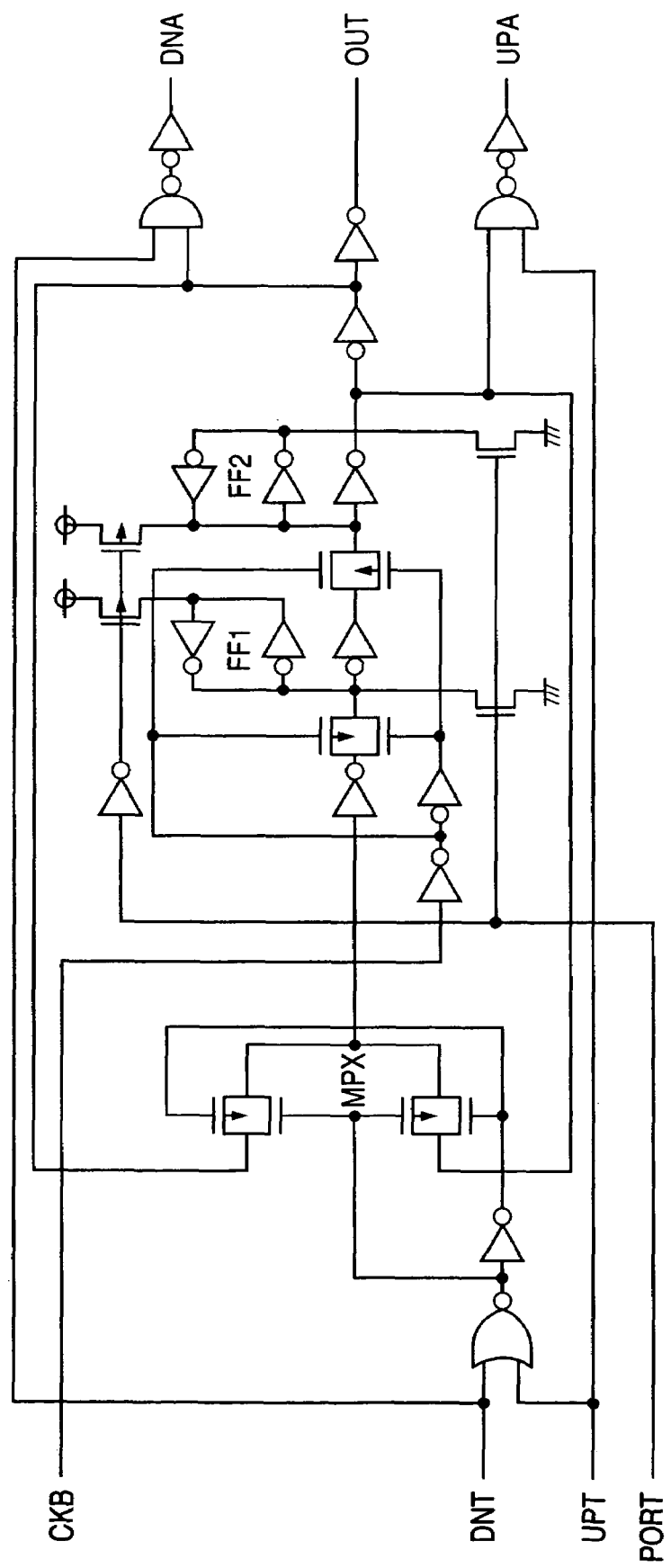
FIG. 22 is a circuit diagram showing a counter.

A circuit diagram showing an embodiment of a counter is shown in FIG. 22. As this circuit, a circuit equivalent to one bit of such 7-bit or 6-bit counters as described above is illustratively shown. A master/slave flip-flop circuit of latches FF1 and FF2 controls the feedback of input and output signals synchronized with a clock CKB to the input side, in response to an up signal UPT and a down signal DNT, thereby executing a +1 up operation or −1 down operation. An output signal DNA is transferred to the next-bit down input DNT, and an output signal UPA is transmitted to the next-bit up input UPT. An output OUT is used as the impedance adjustment or control code.

Figure 23:
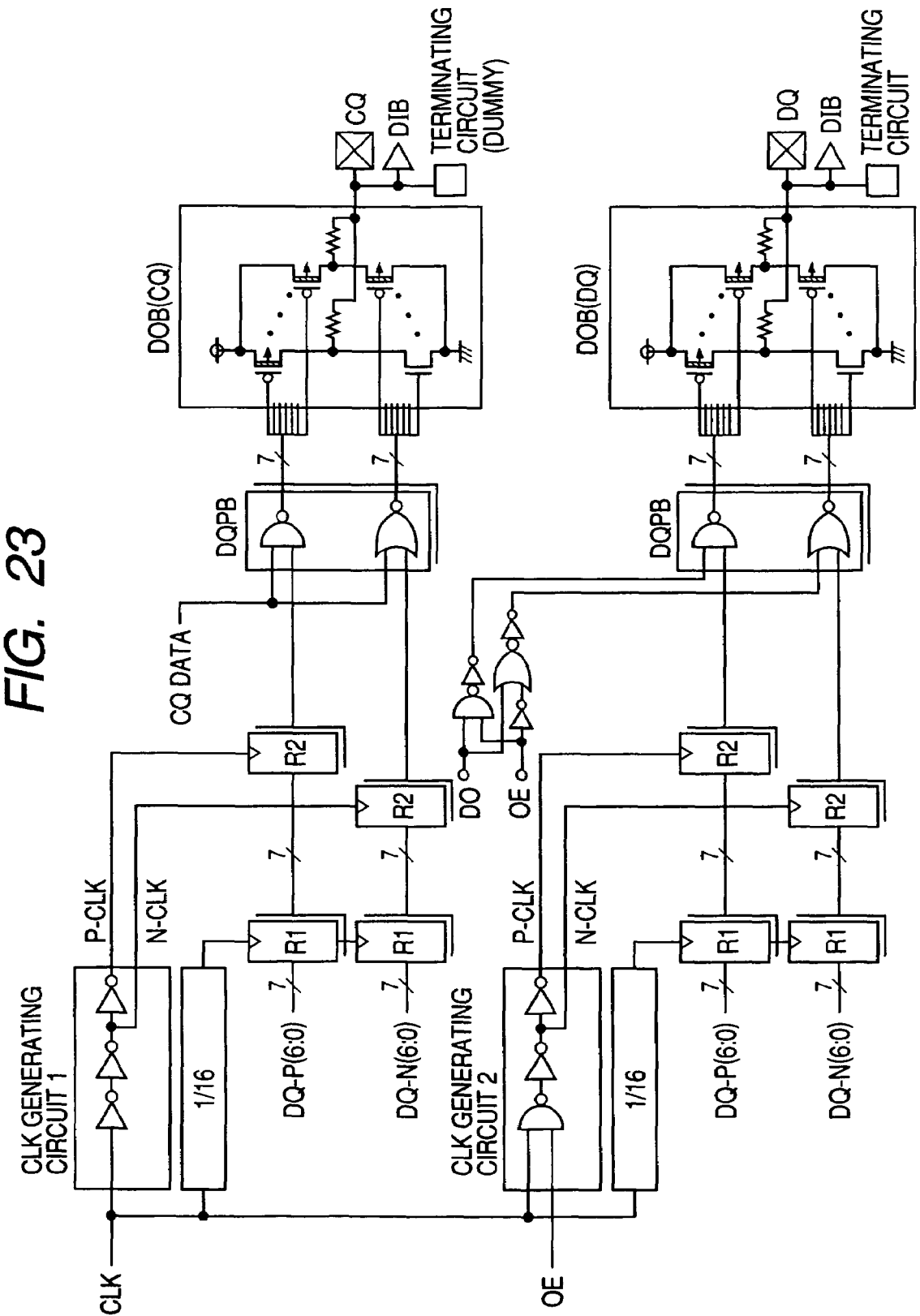
FIG. 23 is a block diagram illustrating an output impedance controller.

A block diagram illustrating an embodiment of an output impedance controller according to the present invention is shown in FIG. 23. Two circuits for data output and data strobe output are illustratively shown. The impedance control code DQ-P (6:0) for the P channel and the impedance control code DQ-N (6:0) for the N channel outputted from the counters or decoders are fetched into first registers R1. The first registers R1 are supplied with a pulse obtained by dividing a clock pulse CLK into ⅟16. Therefore, the impedance control codes DQ-P (6:0) and DQ-N (6:0) are temporarily retained in their corresponding first registers R1 in a cycle equal to ⅟16 of the clock CLK supplied from an external terminal.

Figure 24:
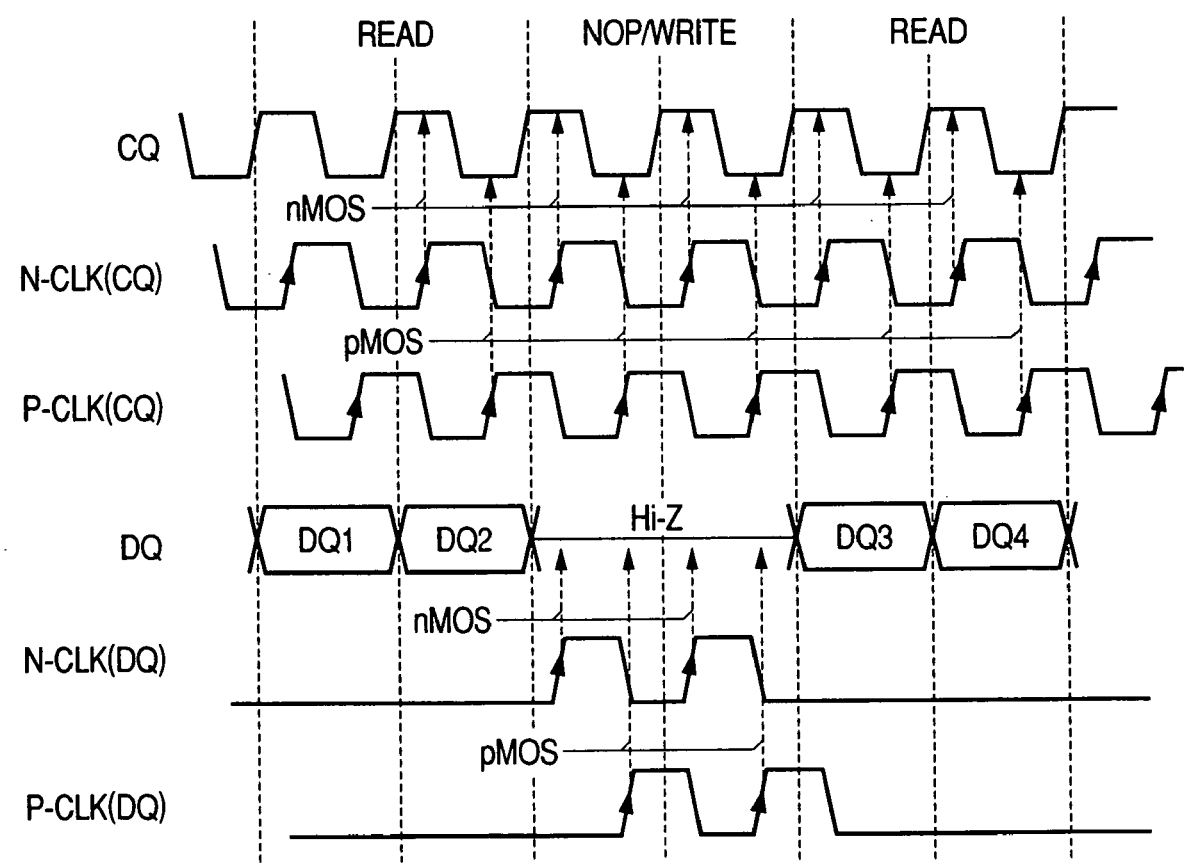
FIG. 24 is a timing diagram for the operation shown in FIG. 23.

Since a data strobe signal CQ is a pulse outputted irrespective of reading and writing for memory operations, it is outputted on a stationary basis. As shown in a timing diagram of FIG. 24, clock pulses P-CLK and N-CLK, respectively shifted by half cycles from the clock pulse CLK, are generated to prevent the occurrence of noise due to a change in output impedance by the data strobe signal CQ, and the impedance control code DQ-P (6:0) for the P channel and the impedance control code DQ-N (6:0) for the N channel are brought to their corresponding second registers, whereby adjustments to the respective output impedances are executed.

The output signals of the second registers R2 and the strobe signal CQ are transmitted to an output circuit DOB through a prebuffer DQPB having a logic circuit. An input circuit DIN and a terminating circuit used as for a dummy are connected to an external terminal CQ for the data strobe to form equivalence to the data output circuit. Similarly, even in the case of the data output circuit, the output signals of the second registers R2 and data DO are transmitted to an output circuit DOB through a prebuffer DQPB having a logic circuit. An input circuit DIN and a terminating circuit are provided at an external terminal DQ to which the output circuit DOB for the data is connected.

In the above configuration, the impedance control code DQ-N (6:0) for the N channel is brought to the corresponding second register R2 in synchronism with the rising edge of the N-CLK with timing provided to output a high level data strobe signal CQ, so that control on the output impedance of an N channel MOSFET (nMOS) (switching of output MOSFET) is effected. Upon timing provided to output a low level data strobe signal CQ with a half-cycle delay, the impedance control code DQ-P (6:0) for the P channel is taken in the corresponding second register R2 in sync with the rising edge of the P-CLK, so that control on the output impedance of a P channel MOSFET (pMOS) (a change in switching) is executed. Thus, since the control of the output impedance is effected when the output MOSFET (nMOS) or (pMOS) is in an off state, no noise occurs in the data strobe signal CQ being outputted.

Since the data output operation is carried out only upon the reading for the memory operation, clock pulses P-CLK and N-CLK to be transferred to the corresponding second registers R2 are generated using an output enable signal OE. That is, when the output DQ is of high impedance Hi-Z in a NOP (no-operation)/write mode, as shown in the timing diagram of FIG. 24, the clock pulses P-CLK and N-CLK are generated and the impedance control code DQ-N (6:0) for the N channel is brought to the corresponding second register R2 in synchronism with the rising edge of the N-CLK, so that control (change) of the output impedance of an N channel MOSFET (nMOS) is effected. In sync with the rising edge of the P-CLK, the impedance control code DQ-P (6:0) for the P channel is taken in the corresponding second register R2, so that control (change) of the output impedance of a P channel MOSFET (pMOS) is effected. Thus, since the control (change) of the output impedance is not carried out upon the read operation, no noise occurs in the data output signal DQ.

Figure 25:
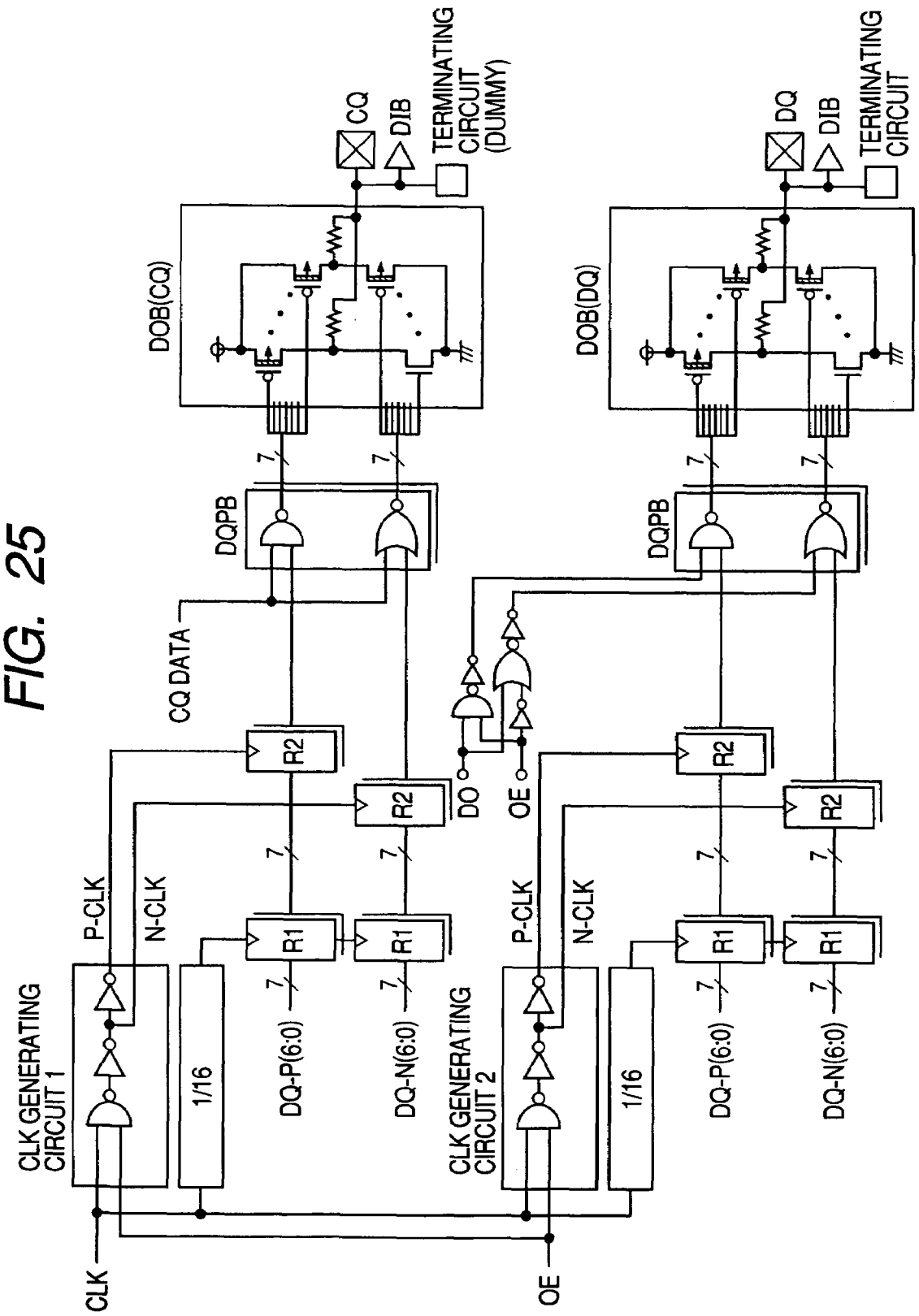
FIG. 25 is a block diagram showing the output impedance controller.
Figure 26:
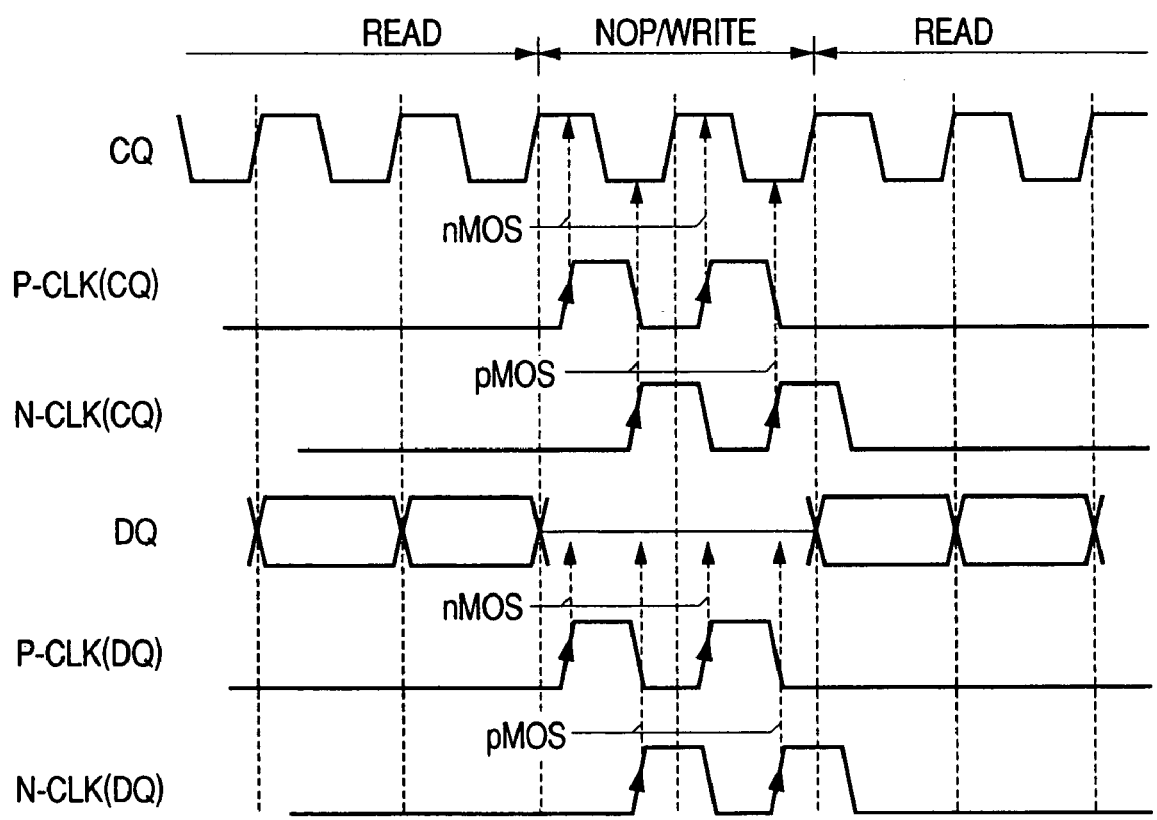
FIG. 26 is a timing diagram for the operation shown in FIG. 25.

A block diagram showing an embodiment of the output impedance controller according to the present invention is shown in FIG. 25. The present embodiment includes a modification of the embodiment shown in FIG. 23. In a manner similar to the case for the above data output even in the case for data strobe output, clock pulses P-CLK and N-CLK, to be transmitted to second registers R2, are generated using an output enable signal OE. Thus, control on the output impedance is effected in the same manner as the data output circuit as shown in a timing diagram of FIG. 26.

In an ultrahigh-speed LSI like a synchronous SRAM, a tracking characteristic between a data strobe signal CQ and a data output DQ becomes important. In consideration of the tracking characteristic, the timing provided to control (change) the Update output impedance of the data strobe signal CQ is made identical to the timing for the data output DQ. As in CLK generating circuits 1 and 2, the same clock pulses P-CLK and N-CLK as that used when the data output DQ is used with respect to the data strobe signal CQ are used to realize impedance switching between the data strobe signal and the data output (CQ/DQ), with the same number of times and the same timing. In consideration of noise (update noise) produced upon the control on the output impedance of the data strobe signal CQ as described above, the impedance control, i.e., the impedance switching, is performed while a P channel MOSFET and an N channel MOSFET are being shifted by a half cycle from each other. It is thus possible to eliminate the influence of noise at the update and realize a satisfactory CQ/DQ tracking characteristic.

Figure 27:
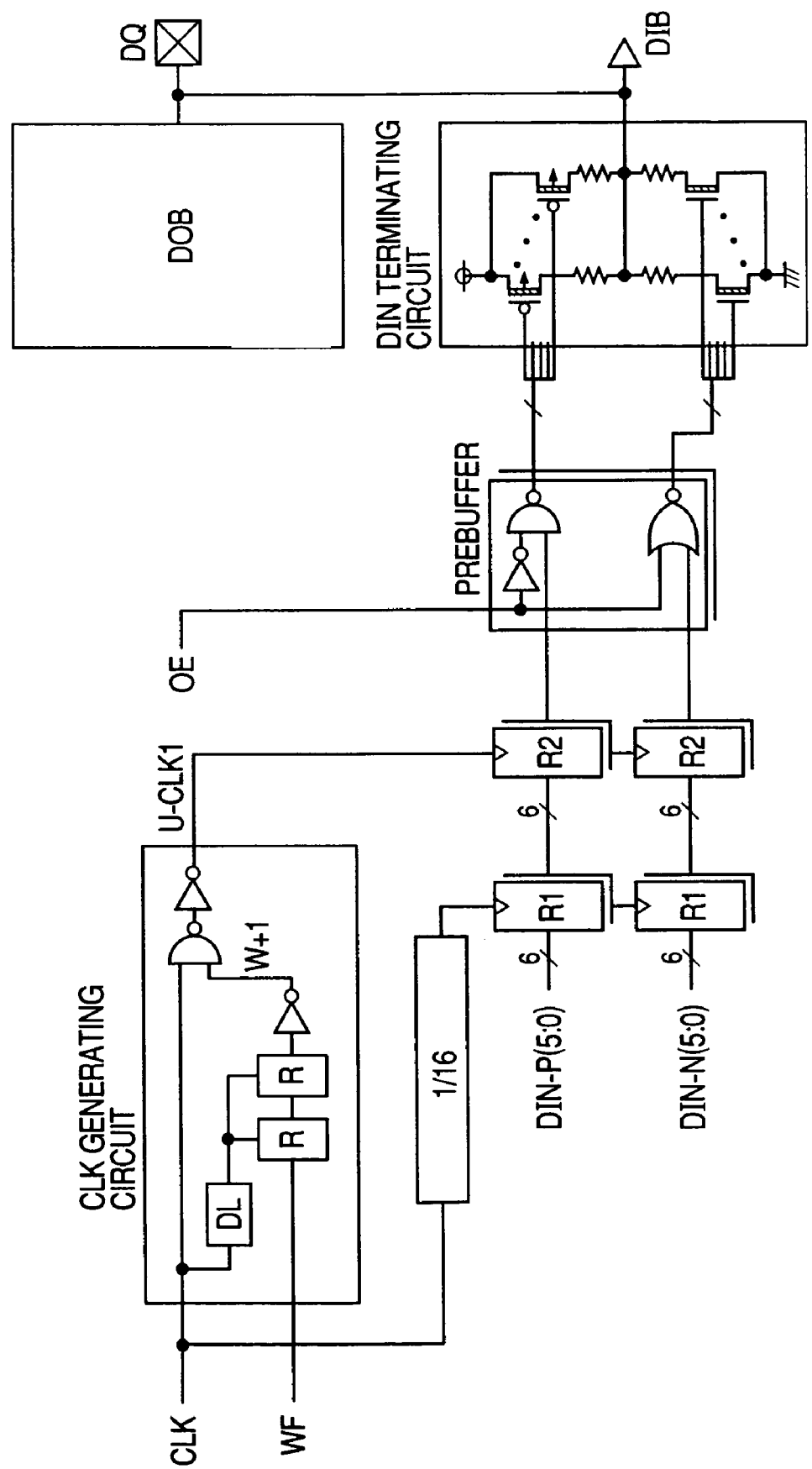
FIG. 27 is a block diagram depicting an input terminal controller.

A block diagram showing an embodiment of an input terminal controller according to the present invention is shown in FIG. 27. The present embodiment is intended for a terminating circuit connected to a DQ terminal. A data output circuit DOB, a data input circuit DIN, and a DIN terminating circuit such as shown in FIG. 23 or 25, are connected to the DQ terminal. The impedance control code DIN-P (5:0) for the P channel and the impedance control code DIN-N (5:0) for the N channel, both of which are outputted from the counters or decoders, are brought to their corresponding first registers R1. The first registers R1 are supplied with a pulse obtained by dividing a clock pulse CLK into ¹⁄₁₆, for example. Therefore, the impedance control codes DIN-N (5:0) and DIN-N (5:0) are temporarily retained in their corresponding first registers R1 in a cycle equal to ¹⁄₁₆ of the clock CLK supplied from an external terminal.

Figure 29:
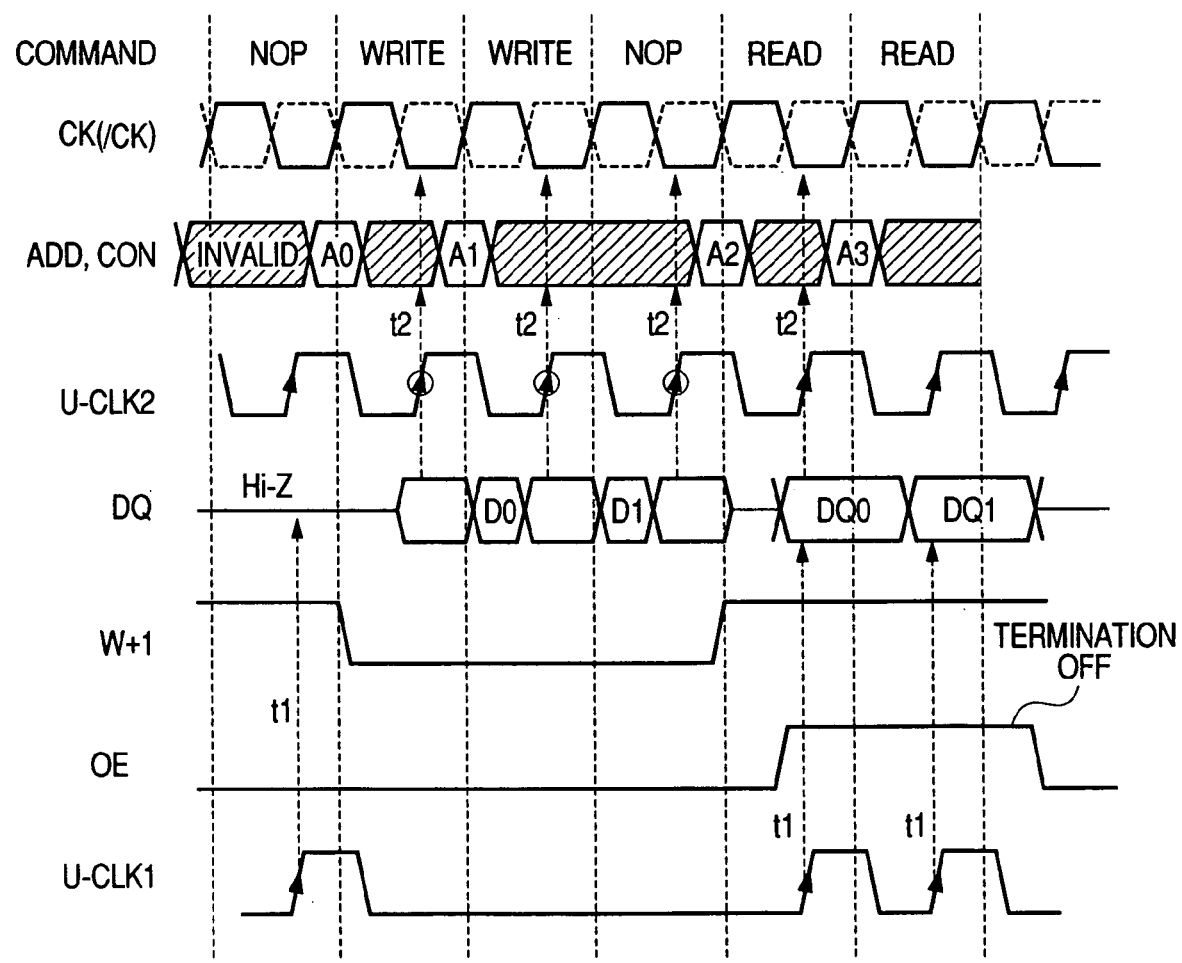
FIG. 29 is timing diagram for describing the operations of that shown in FIGS. 27 and 28.

Since a data input operation is performed only upon a write operation for a memory operation, a clock pulse U-CLK1 to be transmitted to second registers R2 is generated by a CLK generating circuit through the use of a write flag WF. That is, as shown in a timing diagram of FIG. 29, a timing signal of W+1 (write+1 cycle) is formed and a clock pulse U-CLK1 is generated exclusive of its period. As a result, the terminating circuit connected to the DQ terminal is operated as follows. When the DQ terminal is placed at an output high impedance Hi-Z and under data output operations DQ0 and DQ1, the impedance control codes DIN-P (5:0) and DIN-N (5:0) are brought to their corresponding second registers R2 in sync with the rise timing t1 of the U-CLK1, so that terminating resistance control (change) is effected. A prebuffer is controlled by an output enable signal OE to bring terminal MOSFETs to an off state.

Thus, the updating of the impedance control codes DIN-P (5:0) and DIN-N (5:0) at the input terminal with respect to the input/output data terminal DQ is carried out at the output high impedance Hi-Z or at the data output (read). That is, the updating of the impedance control codes DIN-P (5:0) and DIN-N (5:0) is not carried out upon write of an SRAM in which the input of data is performed. In the present embodiment, a W+1 cycle signal is formed using the write flag WF as described above to realize write latency 1 in association with the specs of the SRAM. Thus, it is possible to eliminate the influence of update noise of the impedance control codes DIN-P (5:0) and DIN-P (5:0) at the input terminal to input data at the data input. The MOSFETs of the terminating circuit are respectively set to an off state using the output enable signal OE upon the output of data.

Figure 28:
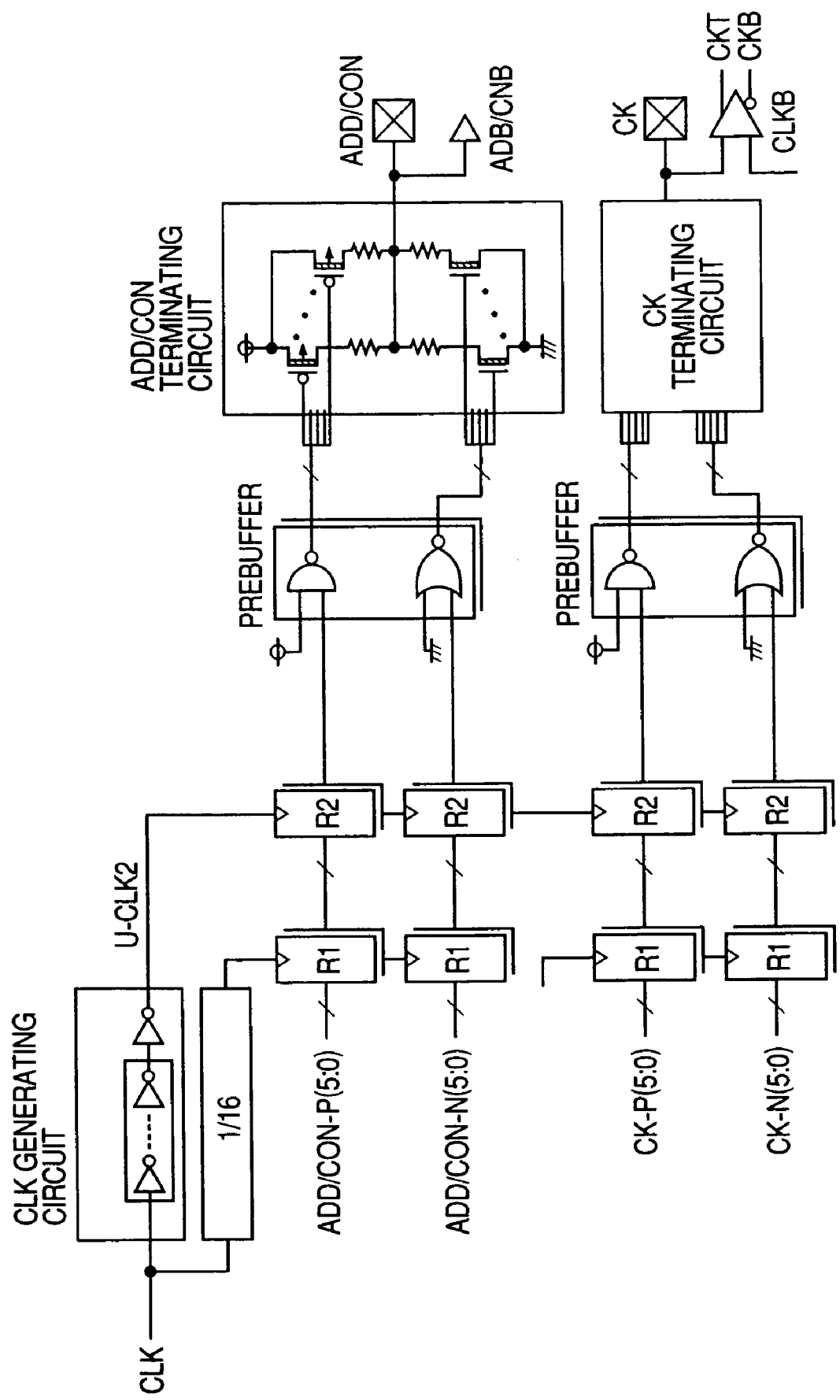
FIG. 28 is a block diagram illustrating an input terminal controller.

A block diagram illustrating an embodiment of an input terminal controller according to the present invention is shown in FIG. 28. The present embodiment is intended for a terminating circuit connected to an ADD/CON (address/control) terminal and a CK (CLK) terminal. Impedance control codes DIN-P (5:0) and DIN-N (5:0) at an input terminal with respect to an address/control signal are processed or executed at a timing t2 at which the input of the address/control signal is in an INVALID state, as shown in the timing diagram of FIG. 29. Impedance control codes DIN-P (5:0) and DIN-N (5:0) at the input terminal with respect to a clock signal CK (/CK) are processed or executed when the input of the address/control signal and the input of write data to an SRAM are in an INVALID state.

Upon capturing of the address/control signal and the data signal, the updating of the impedance control codes DIN-P (5:0) and DIN-N (5:0) at the input terminals with respect to the address/control and clock signals is not performed. Therefore, a CLK generating circuit generates a clock pulse U-CLK2, using a delay circuit DL, and transmits it to the corresponding second registers R2, where the capturing of the impedance control codes DIN-P (5:0) and DIN-N (5:0) is carried out. Owing to such a configuration, the influence of update noise of the impedance control codes DIN-P (5:0) and DIN-N (5:0) at the input terminals to the address/control, and clock signals at the capturing of the address/control and data signals, can be eliminated. It may be feasible to generate a clock pulse U-CLK2 through the use of a clock signal directly outputted from a ¹⁄₁₆ division circuit without using the CLK generating circuit and the second registers and perform updating.

Although the invention has been described herein by way of certain exemplary embodiments, the present application is not limited to such exemplary embodiments. Various changes or modifications may be made to the present invention, as will be apparent to those skilled in the art in light of the disclosure herein, without departing from the spirit or scope of the present invention. It may be feasible to provide a mode for turning off a full terminating resistance circuit, for example. Thus, an increase in power consumption at a low frequency operation and an on-burn-in operation or the like can be suppressed. The present invention can be widely used in various semiconductor integrated circuit devices in addition to a semiconductor memory.

In the present invention, there may be provided a plurality of sets of circuits, each of which generates an impedance code through the use of an impedance control circuit in association with a resistive element connected to an external terminal, and wherein the impedance is varied in accordance with such an impedance code. The impedance control circuit includes an impedance comparator which is formed equivalently to the resistive element and the plurality of sets of circuits, and which performs an impedance comparison with each of replica circuits to thereby form an up signal that increases the impedance, and a down signal that decreases the impedance. Counters are provided adjacent to the plurality of sets of circuits to thereby generate the impedance codes in response to the up signal and the down signal. It is thus possible to reduce the number of wirings that pass through a chip central portion, and also to reduce the probability of a cord-blown failure due to foreign materials and breaks with respect to the number of wirings.

First impedance circuits and second impedance circuits, each of which varies impedance in accordance with an impedance code, are provided in parts, except for a central portion, of a semiconductor chip. A first circuit and a second circuit are respectively formed equivalently to a first resistive element and the first impedance circuits, and perform impedance comparisons with replica circuits to thereby supply the impedance codes to the first and second impedance circuits. The external terminal and the first and second circuits are connected to one another by redistribution wirings. It is thus possible to reduce the number of wirings that pass through a chip central portion, and also to lessen the probability of a cord-blown failure due to foreign materials and breaks with respect to the number of wirings.

An impedance control circuit generates an impedance code in association with a resistive element connected to an external terminal, and coverts the impedance code to serial data and transfers the same to a plurality of sets of impedance circuits, each of which varies the impedance. The plurality of sets of impedance circuits reproduce the impedance code from the serial data. Consequently, the number of wirings that pass through a chip central portion can be lessened and the probability of a cord-blown failure due to foreign materials and breaks with respect to the number of wirings can be also reduced.

What is claimed is:

1. A semiconductor integrated circuit device, comprising:
    a plurality of sets of output circuits each of which varies an output impedance in accordance with a first impedance code;
    a first impedance control circuit which generates the first impedance code in association with a first resistive element connected to a first external terminal and includes an first encoder which coverts the first impedance code to serial data;
    a plurality of sets of terminating circuits each of which varies a terminal impedance in accordance with a second impedance code;
    a second impedance control circuit which generates the second impedance code in association with a second resistive element connected to a second external terminal and which includes a second encoder which converts the second impedance code to serial data; and
    a third external terminal (DQ) which is coupled both of the plurality of sets of output circuits and the plurality of sets of terminating circuits,
    wherein each of the plurality of sets of output circuits includes a decoder which reproduces the first impedance code in response to the serial data,
    wherein the plurality of sets of terminating circuits respectively include decoders each of which reproduces the second impedance code in response to the serial data,
    wherein the each of the plurality of sets of output circuits are enable and the plurality of sets of terminating circuits are disable while output data is outputting, and
    wherein the each of the plurality of sets of output circuits are disable and the plurality of sets of terminating circuits are enable while input data is inputting.

2. A semiconductor integrated circuit device according to claim 1,
    wherein the first impedance control circuit comprises:
    a first impedance comparator that includes replica circuits having an impedance equivalent to the first resistive element and each of the output circuits, and which performs an impedance comparison with each of the replica circuits to form a first signal that increases the output impedance and a second signal that decreases the output impedance; and
    A first counter which increases a count value in response to the first signal and decreases the count value in response to the second signal to generate the impedance code.

3. A semiconductor integrated circuit device according to claim 2,
    wherein each of the output circuits is capable of controlling a through rate in accordance with a through rate code.

4. A semiconductor integrated circuit device according to claim 1,
    wherein the plurality of sets of output circuits include latches respectively, and
    wherein capturing of the first impedance code is performed by each of the latches in accordance with a clock pulse, and wherein controls on output impedances of the respective output circuits are performed synchronously with one another.

5. A semiconductor integrated circuit device according to claim 1,
    wherein, the second impedance control circuit comprises:
    a second impedance comparator having replica circuits of an impedance substantially equivalent to the second resistive element and each of the terminating circuits, and which performs an impedance comparison with each of the replica circuits to form a third signal that increases the terminal impedance and a fourth signal that decreases the terminal impedance; and
    a second counter which increases a count value in response to the third signal and decreases the count value in response to the fourth signal to generate the second impedance code.

6. A semiconductor integrated circuit device according to claim 1,
    wherein the plurality of sets of terminating circuits include latches respectively, and capturing of the second impedance code is performed by each of the latches in accordance with a clock pulse, and
    wherein controls on impedances of the respective terminating circuits are performed synchronously.

* * * * *